US012787577B2

(12) United States Patent
Li et al.

(10) Patent No.: US 12,787,577 B2
(45) Date of Patent: Nov. 3, 2026

(54) DISPLAY PANEL AND METHOD FOR PREPARING THE DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Shaopeng Li, Beijing (CN); Wenze Li, Beijing (CN); Weiben Zhang, Beijing (CN); Jianhua Shu, Beijing (CN); Peng Wang, Beijing (CN); Rongkun Fan, Beijing (CN); Jialin Wang, Beijing (CN); Bilun Zhang, Beijing (CN); Hao Deng, Beijing (CN); Fei Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 357 days.

(21) Appl. No.: 18/578,711

(22) PCT Filed: Nov. 30, 2022

(86) PCT No.: PCT/CN2022/135211
§ 371 (c)(1),
(2) Date: Jan. 11, 2024

(87) PCT Pub. No.: WO2024/113196
PCT Pub. Date: Jun. 6, 2024

(65) Prior Publication Data
US 2025/0126989 A1 Apr. 17, 2025

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .......................... H10K 59/131; H10K 59/1201
See application file for complete search history.

(56) References Cited

U.S. PATENT DOCUMENTS 5,959,709 A * 9/1999 Asada .................... H05K 1/147 349/150
9,798,414 B2 * 10/2017 Kim .......................... G06F 1/16
(Continued)

FOREIGN PATENT DOCUMENTS

CN 108260293 A 7/2018
CN 108364986 A 8/2018
(Continued)

OTHER PUBLICATIONS

International Search Report issued in Application No. PCT/CN2022/135211, with English translation, dated Aug. 23, 2023. (5p).
(Continued)

*Primary Examiner* — Peniel M Gumedzoe
(74) *Attorney, Agent, or Firm* — Arch & Lake LLP

(57) ABSTRACT

The present disclosure provides a display panel and a method for manufacturing the display panel. The display panel includes a display array, a chip and a circuit board. The array substrate includes a display portion and a transition portion, a bending portion and a first bonding portion which are connected in sequence at an end of the display portion. The first bonding portion is bent through the bending portion to a side of the transition portion in a second direction Y. The circuit board includes a body portion and a second bonding portion. A second bonding electrode of the second bonding portion is connected to the first bonding electrode. The first bonding portion has a sticking-out portion at an end of the first bonding electrode connected to the second bonding
(Continued)

electrode. The sticking-out portion extends along the first direction X.

20 Claims, 17 Drawing Sheets

(56) References Cited

U.S. PATENT DOCUMENTS

| | | | |
|---|---|---|---|
| 10,509,277 B2 | 12/2019 | Bai et al. | |
| 2017/0099736 A1* | 4/2017 | Jung | H05K 7/20963 |
| 2019/0204651 A1 | 7/2019 | Bai et al. | |
| 2020/0022261 A1 | 1/2020 | Choi | |
| 2021/0360770 A1 | 11/2021 | Bao | |
| 2022/0050543 A1* | 2/2022 | Luo | G06F 3/0412 |

FOREIGN PATENT DOCUMENTS

| | | |
|---|---|---|
| CN | 209345209 U | 9/2019 |
| CN | 112969280 A | 6/2021 |
| CN | 113133201 A | 7/2021 |
| CN | 114423149 A | 4/2022 |
| CN | 114863813 A | 8/2022 |
| CN | 115083291 A | 9/2022 |
| CN | 217386604 U | 9/2022 |
| CN | 11535971 A | 11/2022 |
| CN | 115359731 A | 11/2022 |
| EP | 3910920 A1 | 3/2020 |

OTHER PUBLICATIONS

Written Opinion issued in Application No. PCT/CN2022/135211, with English translation, (3p).

* cited by examiner

DISPLAY PANEL AND METHOD FOR PREPARING THE DISPLAY PANEL

CROSS REFERENCE TO RELATED DOCUMENTS

This application is a national stage entry of International Application No. PCT/CN2022/135211, filed Nov. 30, 2022, the entire disclosure of which is incorporated herein by reference.

TECHNICAL FIELD

The present disclosure relates to the field of display technology, and in particular, to a display panel and a method for preparing the display panel.

BACKGROUND

With the developments of the OLED market, insufficient battery life has become a common problem in the industry. Especially for medium-sized folding mobile phone products, battery life has become a pain point restricting their developments.

It should be noted that the information disclosed in the background section is only for enhancing the understanding of the background of the present disclosure, and therefore may include information that does not constitute prior art known to those of ordinary skill in the art.

SUMMARY

The purpose of the present disclosure is to overcome the above-mentioned shortcomings of related art and provide a display panel and a method for preparing the display panel.

According to an aspect of the present disclosure, there is provided a display panel, including: an array substrate including a display portion and a transition portion, a bending portion and a first bonding portion which are connected in sequence at an end of the display portion, wherein an end of the first bonding portion away from the bending portion has a first bonding electrode, and the first bonding portion is bent to a non-display side of the display portion through the bending portion, and the second direction is perpendicular to a plane where the array substrate is located; a chip bonded to the first bonding portion; and a circuit board including a body portion and a second bonding portion, wherein an end of the second bonding portion away from the body portion has a second bonding electrode, the second bonding electrode is connected to the first bonding electrode, and the body portion and the chip are located at a same side of the second bonding portion in a first direction, and the first direction is perpendicular to an interface between the display portion and the bending portion; wherein the first bonding portion has a sticking-out portion at an end of the first bonding electrode connected to the second bonding electrode, the sticking-out portion extends along the first direction, the second bonding portion exposes the sticking-out portion in a second direction; wherein an extension length of the sticking-out portion in the first direction is L1, and a protruding height of the second bonding portion on the first bonding portion along the second direction is h1, and a ratio ration-between L1 and h1 is larger than or equal to 0.4 and less than or equal to 3.5.

In an example embodiment of the present disclosure, an interface between the first bonding portion and the bending portion is a first interface, and the display panel further includes:

a protective layer located at a side of the first bonding portion away from the transition portion and covering at least the sticking-out portion, wherein a distance in the first direction between a side wall of the protective layer away from the bending portion and a plane where the first interface is located is equal to a distance in the first direction between an end of the sticking-out portion and the plane where the first interface is located, and the protective layer is connected to the first bonding electrode and the second bonding electrode.

In an example embodiment of the present disclosure, a protruding height of the protective layer on the first bonding portion along the second direction is h2, and a ratio between L1 and h2 is larger than or equal to 0.4 and less than or equal to 3.4.

In an example embodiment of the present disclosure, the second bonding portion includes:

a second conductive layer, wherein the second bonding electrode is located in the second conductive layer; and an insulating layer covering the second conductive layer at a side of the second conductive layer away from the first bonding portion;

wherein side walls of the second conductive layer and the insulating layer facing the protective layer are sealed and connected with the protective layer.

In an example embodiment of the present disclosure, the insulating layer has a protruding portion at an end where the second bonding electrode is connected to the first bonding electrode;

wherein in the first direction, a distance between an end of the protruding portion away from the first interface and the plane where the first interface is located is larger than a distance between an end of the second conductive layer away from the first interface and the plane where the first interface is located;

wherein the protective layer is sealed and connected with a side of the protruding portion facing the transition portion.

In an example embodiment of the present disclosure, a surface of the protective layer away from a side of the first bonding portion is a slope surface;

wherein the slope surface forms a climbing structure from a side close to the plane where the first interface is located to a side away from the plane where the first interface is located; and/or, wherein the slope surface forms a downslope structure from the side close to the plane where the first interface is located to the side far away from the plane where the first interface is located.

In an example embodiment of the present disclosure, a side wall of the protective layer facing a side wall of the second bonding portion exposes a side wall of the protruding portion.

In an example embodiment of the present disclosure, a side wall of the protective layer facing a side wall of the second bonding portion exposes a part of a side wall of the protruding portion.

In an example embodiment of the present disclosure, a side wall of the protective layer facing a side wall of the second bonding portion is sealed and connected with a side wall of the protruding portion.

In an example embodiment of the present disclosure, the protective layer has a main extension portion and a secondary extension portion;

wherein the main extension portion covers the sticking-out portion, and the secondary extension portion covers the insulating layer.

In an example embodiment of the present disclosure, an extension length of the secondary extension portion in the first direction is less than or equal to 100 μm.

In an example embodiment of the present disclosure, when the slope surface forms the climbing structure from the side away from the bending portion to the side close to the bending portion, a slope angle of the slop surface is less than or equal to 60°.

In an example embodiment of the present disclosure, the body portion has an open groove which opens up toward the first bonding portion, and a depth of the open groove in the second direction is larger than or equal to 200 μm.

In an example embodiment of the present disclosure, the open groove penetrates the body portion in the second direction;

wherein a thickness of the body portion in the second direction is larger than or equal to 120 μm.

In an example embodiment of the present disclosure, the display panel further includes:

an electronic device located at a side of the chip away from the first bonding portion, wherein an orthographic projection of the electronic device on the first bonding portion and an orthographic projection of the open groove on the first bonding portion is separated.

In an example embodiment of the present disclosure, the array substrate includes:

a base substrate;

a base film located at a side of the base substrate;

a first conductive layer located in the first bonding portion at a side of the base substrate away from the base film, wherein the first bonding electrode is located in the first conductive layer; and a third conductive layer located at a side of the first conductive layer away from the base substrate and connected to the second conductive layer;

wherein an orthographic projection of the second conductive layer on the base substrate covers an orthographic projection of the first conductive layer on the base substrate and an orthographic projection of the third conductive layer on the base substrate, and the orthographic projection of the third conductive layer on the base substrate at least partially overlaps with the orthographic projection of the first conductive layer on the base substrate;

wherein side walls of the first conductive layer and the third conductive layer facing the protective layer are sealed and connected with the protective layer.

In an example embodiment of the present disclosure, the array substrate further includes:

a support layer located in the display portion and the transition portion at a side of the base film away from the base substrate;

a first adhesive layer located between the support layer and the base film;

a second adhesive layer connecting the base film in the first bonding portion and the support layer in the transition portion; and a cover layer located in the display portion at a side of the base substrate away from the base film.

In an example embodiment of the present disclosure, L1 is 50 to 200 μm, and h2 is 60 to 120 μm.

According to a second aspect of the present disclosure, there is provided a method for preparing a display panel. The method is used to prepare the display panel according to any one of the embodiments. The method includes: providing an array substrate and a chip, wherein the array substrate includes a display portion and a transition portion, a bending portion and a first bonding portion which are connected in sequence at an end of the display portion, an end of the first bonding portion away from the bending portion has a first bonding electrode, and the chip is bonded to the first bonding portion; providing a circuit board, wherein the circuit board includes a body portion and a second bonding portion, and an end of the second bonding portion away from the body portion has a second bonding electrode; bonding the second bonding electrode to the first bonding electrode with the body portion and the chip being located at a same side of the second bonding portion in a first direction, wherein the first bonding portion has a sticking-out portion at an end of the first bonding electrode connected to the second bonding electrode, the second bonding portion exposes the sticking-out portion in a second direction, the first direction is perpendicular to an interface between the display portion and the bending portion, and the second direction is perpendicular to a plane where the array substrate is located; cutting the sticking-out portion using a cutting process, wherein an extension length of the sticking-out portion in the first direction after cutting is L1, a protruding height of the second bonding portion on the first bonding portion along the second direction is h1, and a ratio ration L1 and h1 is larger than or equal to 0.4 and less than or equal to 3.5; and bending the bending portion to bend the first bonding portion to a non-display side of the display portion.

In an example embodiment of the present disclosure, before cutting the sticking-out portion using the cutting process, the method further includes:

forming a protective layer at a side of the sticking-out portion, wherein the protective layer is connected to the first bonding electrode and the second bonding electrode;

wherein cutting the sticking-out portion using the cutting process processing:

cutting the protective layer and the sticking-out portion using the cutting process, wherein the protective layer covers the sticking-out portion after cutting.

In an example embodiment of the present disclosure, the method further includes: cutting the array substrate using a cutting process to form a plurality of sub-substrates, wherein the cutting process carried out for the array substrate is performed synchronously with the cutting process carried out for the protective layer and the sticking-out portion.

In an example embodiment of the present disclosure, the array substrate includes a base substrate and a base film. The base film is located in the display portion, the transition portion and the first bonding portion and is located at a side of the base substrate. Before bending the bending portion, the method further includes: forming a support layer at a side of the base film away from the base substrate in the display portion and the transition portion; forming a first adhesive layer between the support layer and the base film to connect the support layer and the base film; forming a second adhesive layer at a side of the base film away from the base substrate in the first bonding portion; and forming a cover layer at a side of the base substrate away from the base film in the display portion.

In the display panel provided by the present disclosure, the array substrate is bent through the bending portion, so that the first bonding portion of the array substrate is bent to the non-display side of the display portion. On this basis, because the body portion of the circuit board and the chip are located at the same side of the second bonding portion, this is equivalent to that the body portion of the circuit board is also located on the back side of the first bonding portion.

This can save the space occupied by the body portion in the body extension direction of the array substrate. When the display panel is used in a display device, the saved space can be used to increase the accommodation space in the display device, such as increasing the space for a battery compartment, thereby increasing the battery capacity of the display device. In addition, by setting the ratio of the extension length of the sticking-out portion and the protruding height of the second bonding portion of the circuit board on the first bonding portion as the above-mentioned proportional relationship, the space occupied by the first bonding portion in the body extension direction of the array substrate after the array substrate is bent, thereby further increasing the battery capacity of the display device.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the present disclosure and together with the specification serve to explain the principles of the present disclosure. Apparently, the drawings in the following description are only some embodiments of the present disclosure, and those skilled in the art may obtain other drawings according to these drawings without creative efforts.

DETAILED DESCRIPTION

Figure 1:
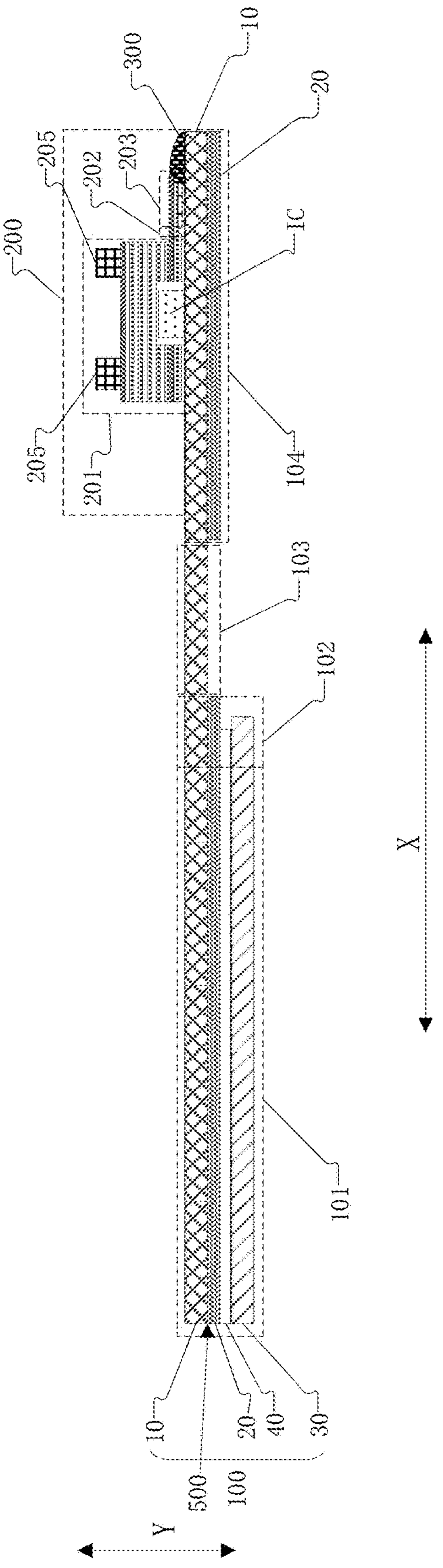
FIG. 1 is a schematic diagram of a semi-finished product structure of a display panel before bending according to an embodiment of the present disclosure.

Example embodiments will now be described more fully with reference to the accompanying drawings. Example embodiments may, however, be embodied in various forms and should not be construed as being limited to the embodiments set forth herein; rather, these embodiments are provided so that the present disclosure will be thorough and complete and will fully convey the concepts of the example embodiments to those skilled in the art. The same reference numerals in the drawings indicate the same or similar structures, and thus their detailed descriptions will be omitted. Furthermore, the drawings are merely schematic illustrations of the present disclosure and are not necessarily drawn to scale.

Figure 2:
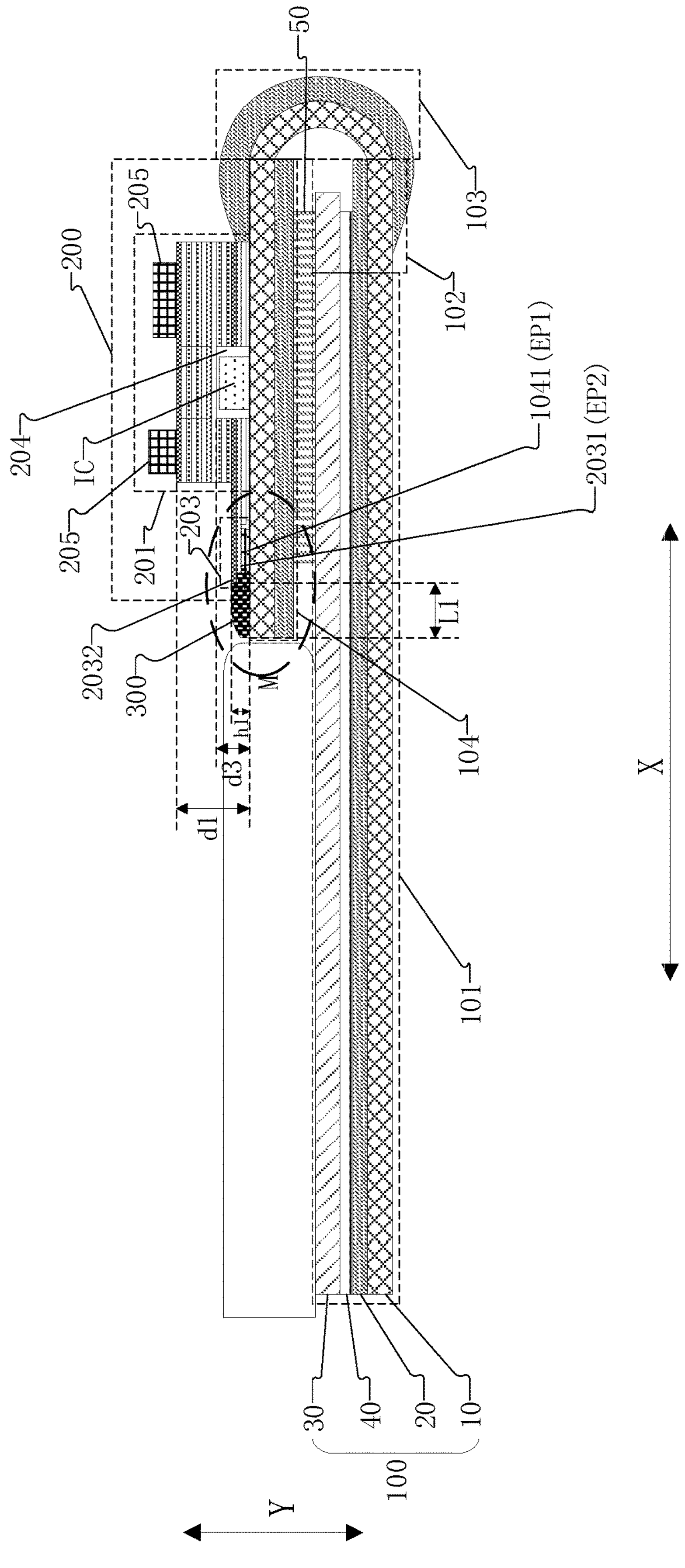
FIG. 2 is a schematic diagram of a finished product structure of the display panel in FIG. 1 after bending.
Figure 3A:
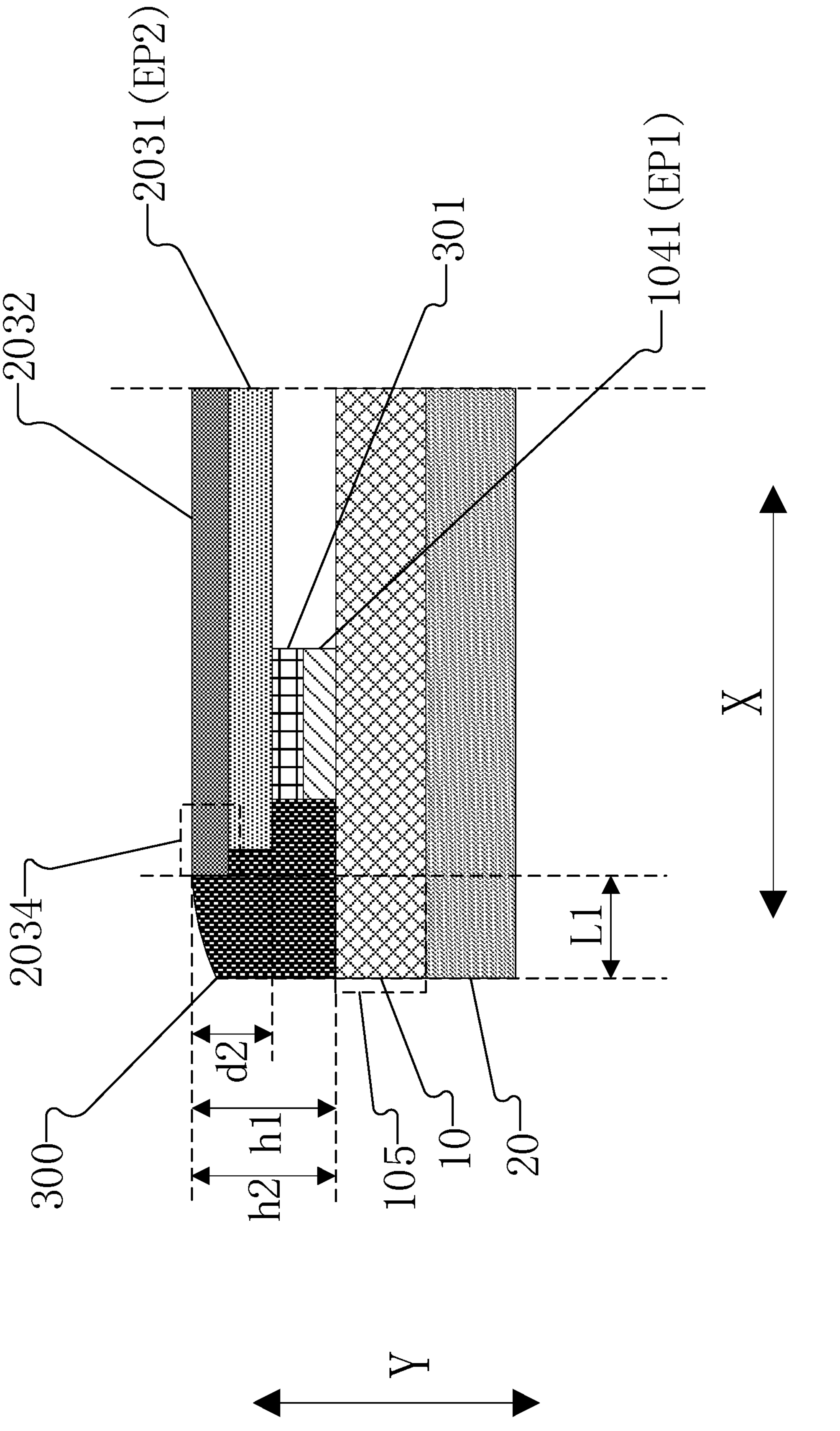
FIG. 3*a* is a partial enlarged view of part M in FIG. 2.

FIG. 1 is a schematic diagram of a semi-finished product structure of a display panel before bending according to an embodiment of the present disclosure. FIG. 2 is a schematic diagram of a finished product structure of the display panel in FIG. 1 after bending. FIG. 3*a* is a partial enlarged view of part M in FIG. 2. As shown in FIG. 1 to FIG. 3*a*, the display panel may include an array substrate 100, a chip IC and a circuit board 200. The array substrate 100 includes a display portion 101, and a transition portion 102, a bending portion and a first bonding portion 104 which are connected in sequence at an end of the display portion 101. An end of the first bonding portion 104 away from the bending portion 103 has a first bonding electrode EP1. The first bonding portion 104 is bent through the bending portion 103 to a non-display side of the display portion 101. A second direction Y is perpendicular to a plane where the array substrate 100 is located. The chip IC is bonded to the first bonding portion 104. The circuit board 200 includes a body portion 201 and a second bonding portion 203. An end of the second bonding portion 203 away from the body portion 201 has a second bonding electrode EP2. The second bonding electrode EP2 is connected to the first bonding electrode EP1. And, the body portion 201 and the chip IC are located at the same side of the second bonding portion 203 in the first direction X. The circuit board 200 further includes a portion 202 between the body portion 201 and the second bonding portion 203. The first bonding portion 104 has a sticking-out portion 105 at an end of the first bonding electrode EP1 connected to the second bonding electrode EP2. The sticking-out portion 105 extends along the first direction X, and the second bonding portion 203 exposes the sticking-out portion 105 in the second direction Y The first direction X is perpendicular to an interface between the display portion 101 and the bending portion 103. An extension length of the sticking-out portion 105 in the first direction is L1, a protruding height of the second bonding portion 203 on the first bonding portion 104 along the second direction Y is h1, and a ratio ration-between L1 and h1 is larger than or equal to 0.4 and less than or equal to 3.5.

In the display panel provided by the present disclosure, the array substrate 100 is bent through the bending portion 103, so that the first bonding portion 104 of the array substrate 100 is bent to the non-display side of the display portion 101. On this basis, because the body portion 201 of the circuit board 200 and the chip IC are located at the same side of the second bonding portion 203, this is equivalent to that the body portion 201 of the circuit board 200 is also located on the back side of the first bonding portion 104. This can save the space occupied by the body portion 201 in the body extension direction of the array substrate. When the display panel is used in a display device, the saved space can be used to increase the accommodation space in the display device, such as increasing the space for a battery compartment, thereby increasing the battery capacity of the display device. In addition, by setting the ratio of the extension length L1 of the sticking-out portion and the protruding height of the second bonding portion 203 of the circuit board on the first bonding portion 104 as the above-mentioned proportional relationship, the space occupied by the first bonding portion 104 in the body extension direction of the array substrate 100 after the array substrate 100 is bent, thereby further increasing the battery capacity of the display device.

The display panel described in the present disclosure is a flexible display panel. By arranging the bending portion 103, partial structure of the display panel may be reversely bent, thereby reducing the length of the display panel and increasing the screen-to-body ratio of the display panel. As can be seen from FIG. 1 and FIG. 2, after the display panel is bent, the first bonding portion 104 is bent to the non-display side of the display portion 101 (i.e., the back of the display panel). In this way, by using the back space of the display panel in the second direction Y (that is, the thickness direction), the back space of the display panel in the first direction X (that is, the length direction) is saved, thereby reducing the length of the display panel and increasing the screen-to-body ratio of the display panel. In the present disclosure, after the bending portion 103 is bent, the first bonding portion 104 can be parallel with the transition portion 102, that is, the first bonding portion 104 extends along the first direction X at a side of the transition portion 102.

It can be understood that the array substrate 100 generally includes a base substrate, and the base substrate extends from the display portion 101 to the first bonding portion 104. A protruding height of a certain structure on the first bonding portion 104 described in the present disclosure can be understood as a protruding height of the structure on the base substrate in the first bonding portion 104. For example, a side of the second bonding portion 203 away from the first bonding portion 104 is an upper surface of the second bonding portion 203, and the protruding height h1 of the second bonding portion 203 on the first bonding portion 104 along the second direction Y can be understood as a distance in the second direction Y between the upper surface of the second bonding portion 203 and a surface of the base substrate in the first bonding portion 104 facing the second bonding portion 203.

The transition portion 102 connects the display portion 101 and the bending portion 103. The transition portion 102 may be, for example, a lower borher area of a terminal device. In an actual product, the transition portion 102 is relatively small, and only part of the first bonding portion 104 on the back of the display panel is opposite to the transition portion 102, and the other part is opposite to the display portion 101. FIG. 1 and FIG. 2 are only used as illustration for convenience in understanding, and do not show the entire structure of the display portion, and the lengths of the display portion, the transition portion, the bending portion and the first bonding portion shown in the figures in the first direction X cannot be understood as constituting limitation on the size of respective parts. In actual product, the size of the display portion in the first direction X is much larger than the size of the transition portion in the first direction X.

The first direction X of the present disclosure is perpendicular to the interface between the display portion 101 and the bending portion 103, that is, the first direction X is parallel with a plane 500 where the display portion 101 is located, and is parallel with an extension direction of the display portion 101. The extension direction of the display portion 101 may be understood as an extension direction of the display portion 101 in its length direction.

It is worth noting that a certain structure A extends along a direction B described in the present disclosure means that A may include a main part and a secondary part connected to the main part, the main part is a line, a line segment or a bar-shaped body, and the main part extends along the direction B, and the length of the main part extending in direction B is larger than the length of the secondary part extending in other direction(s).

Referring to FIG. 2, after the display panel is bent, the body portion 201 of the circuit board 200 occupies the back space of the display panel in the first direction X. It can be known that in a display device in which a display panel is applied, the back space of the display panel is mainly used to place a battery. As the display screen increases, the battery life directly affects user experience. Therefore, it is needed to increase the battery capacity as much as possible within the limited space, that is, to increase the back space of the display panel in the first direction X. After the array substrate 100 is bent, the body portion 201 of the circuit board 200 occupies the back space of the display panel in the first direction X, thereby limiting the battery size of the display device and limiting the endurance of the display device.

As shown in FIG. 2, in the display panel of the present disclosure, the chip IC is bonded to the first bonding portion 104. The body portion 201 of the circuit board 200 and the chip IC are located at the same side of the second bonding portion 203 in the first direction X, that is, both the body portion 201 and the chip IC are located at a side of the first bonding portion 104 away from the display portion 101, so that the body portion 201 of the circuit board 200 is opposite to the first bonding portion 104 of the array substrate 100 in the second direction Y In other words, the circuit board 200 and the first bonding portion 104 of the array substrate 100 are stacked on the back of the display panel, thereby increasing the back space of the display panel in the first direction X by utilizing the thickness space of the display panel in the second direction Y Thus, the battery life of the display device can be increased to meet the endurance requirement of the display device.

As shown in FIGS. 2 and 3*a*, after the array substrate 100 is bent, the sticking-out portion 105 refers to a part of the first bonding portion 104 extending further than the second bonding portion 203 in a direction away from the bending portion 103, so that the second bonding portion 203 exposes the sticking-out portion 105 in the second direction Y In other words, the second bonding portion 203 is closer to the bending portion 103 than the first bonding portion 104 in the first direction X. The sticking-out portion 105 extends along the first direction X on the back of the display panel, which may occupy the back space of the display panel in the first direction X. The present disclosure sets the ratio of the extension length L1 to the protruding height h1 of the second bonding portion 203 to be 0.4~3.5, for example, the ratio may be 0.4, 0.45, 0.5, 0.8, 1.0, 1.1, 1.2, 1.5, 1.8, 2.0, 2.4, 2.6, 2.8, 3.0, 3.1, 3.2, 3.5, etc. This arrangement can further reduce the space occupied by the sticking-out portion 105 in the first direction X, that is, this arrangement can save the back space of the display panel in the first direction X, and the saved space can further increase the size of the battery of the display device, thereby further increasing the battery life. In an example embodiment, the extension length L1 of the sticking-out portion 105 may specifically be 50-200 μm, for example, the extension length L1 may be 50 μm, 100 μm, 150 μm, 200 μm, etc. The protruding height h1 of the second bonding portion 203 on the first bonding portion 104 along the second direction Y may be specifically 58–110 μm, for example, the protruding height h1 may be 58 μm, 60 μm, 70 μm, 80 μm, 90 μm, 100 μm, 110 μm, etc.

In an example embodiment, the extension length L1 of the sticking-out portion 105 in the first direction X may be cut through a cutting process, so that the extension length L1 of the sticking-out portion 105 in the first direction X can meets a requirement. For example, the sticking-out portion 105 may be cut by a laser cutting process to control the length of the sticking-out portion 105.

It can be understood that the protruding height h1 of the second bonding portion 203 on the first bonding portion 104 is related to the material of the second bonding portion 203, a conductive material connecting the first bonding electrode EP1 and the second bonding electrode EP2 and the accuracy of a lamination process for laminating the above components. In an example embodiment, after the protruding height h1 of the second bonding portion 203 on the first bonding portion 104 is determined, the extension length L1 of the sticking-out portion 105 in the first direction X may be determined according to the determined protruding height h1 of the second bonding portion 203 and the above proportional relationship, and then cutting is performed use a cutting process. Of course, the extension length L1 of the sticking-out portion 105 needs to be specifically controlled in combination with the cutting accuracy of the cutting process.

Figure 3B:
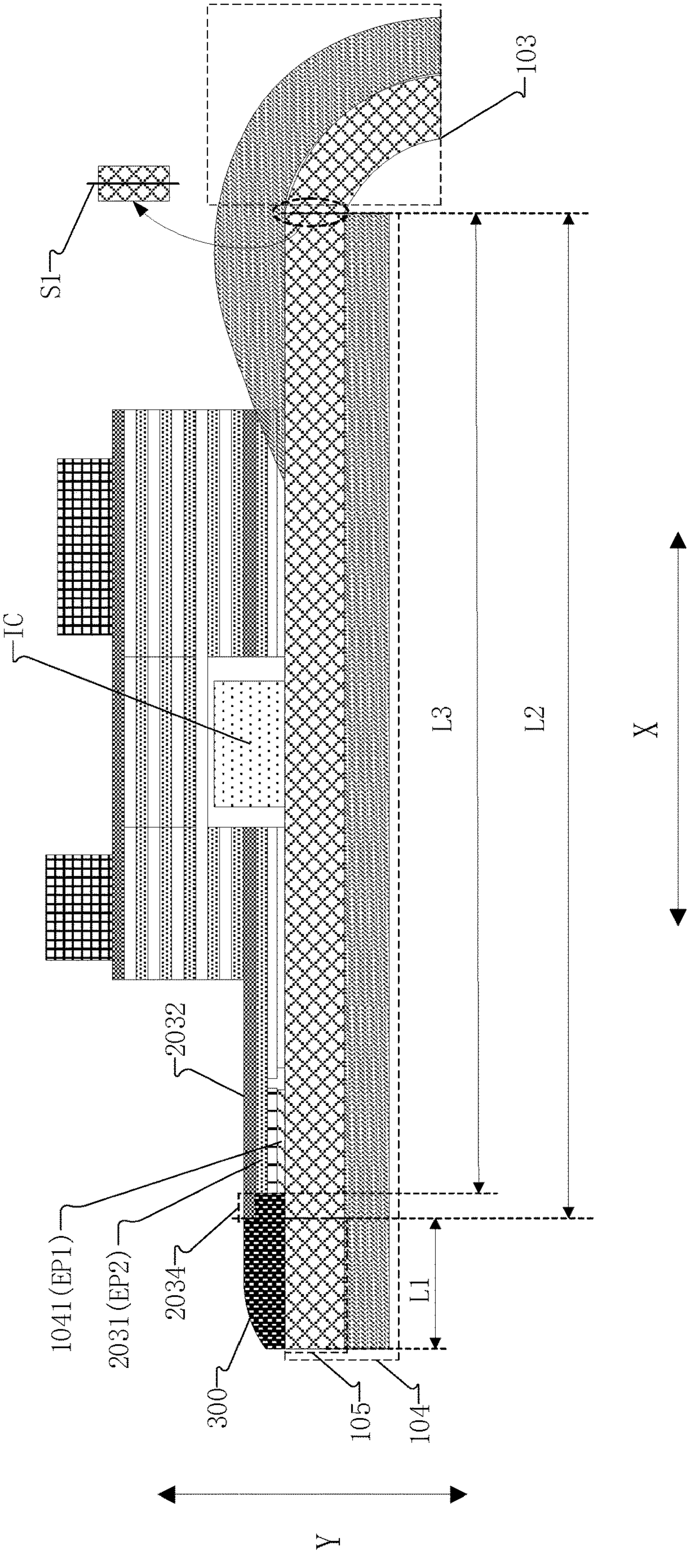
FIG. 3*b* is a partial enlarged view of a first bonding portion and a bending portion in FIG. 2.

FIG. 3*b* is a partial enlarged view of the first bonding portion and the bending portion in FIG. 2. As shown in FIG. 3*b*, the interface between the first bonding portion 104 and the bending portion 103 is a first interface S1. Referring to FIG. 3*a* and FIG. 3*b*, a side of the second bonding portion 203 away from the bending portion 103 has a first side wall opposite to the plane where the first interface S1 is located in the first direction X. A side of the sticking-out portion 105 away from the bending portion 103 has a second side wall opposite to the plane where the first interface S1 is located in the first direction X. The extension length L1 of the sticking-out portion 105 along the first direction X may be understand as a distance in the first direction X between the second side wall of the sticking-out portion 105 and the first side wall of the second bonding portion 203.

It should be understood that the state shown in FIG. 1 is only an intermediate state during the preparation process of the display panel, and FIG. 2 shows the final state of the formed display panel. Therefore, distances involved herein all refer to distances between respective structures after the array substrate 100 is bent as shown in FIG. 2, unless otherwise specifically stated.

As shown in FIG. 1 to FIG. 3*a*, in an example embodiment, the display panel may further include a protective layer 300. The protective layer 300 is connected to the first bonding electrode EP1 and the second bonding electrode EP2, and the protective layer 300 at least covers the sticking-out portion 105 at a side of the first bonding portion 104 away from the transition portion 102. The protective layer 300 connects the first bonding electrode EP1 and the second bonding electrode EP2, thereby isolating the first bonding electrode EP1 and the second bonding electrode EP2 from the external environment and preventing external moisture from entering the bonding portions of the array substrate 100 and the circuit board 200. Accordingly, this can protect the bonding electrode(s) from being oxidized and corroded. The material of the protective layer 300 may be, for example, UV adhesive, and the UV adhesive may be coated on the sticking-out portion 105 through a coating process to form the protective layer 300.

As shown in FIG. 3*b*, in an example embodiment, a distance in the first direction X between a side wall of the protective layer 300 away from the bending portion 103 and the plane where the first interface S1 is located is equal to a distance in the first direction X between an end of the sticking-out portion 105 and the plane where the first interface S1. In this way, The protective layer 300 can isolate the binding portion of the array substrate and the circuit board from the external environment without occupying additional space on the back of the display panel in the first direction X, thereby ensuring that the battery capacity of the display device can be increased.

As shown in FIG. 3*a*, a protruding height of the protective layer 300 on the first bonding portion 104 along the second direction Y is h2. The ratio of L1 to h2 is larger than or equal to 0.4 and less than or equal to 3.4. For example, the ratio may be 0.4, 0.45, 0.5., 0.8, 0.9, 1.0, 1.4, 1.5, 1.8, 2.0, 2.5, 3.0, 3.2, 3.3, 3.34, or 3.4, etc. Therefore, within the allowable range of process accuracy, it is ensured that the protective layer 300 covers the sticking-out portion 105 and the extension lengths of the sticking-out portion 105 and the protective layer 300 in the first direction X are reduced as much as possible to save the back space of the display panel in the first direction X, thereby increasing the battery capacity of the display device. In an example embodiment, the extension length L1 of the sticking-out portion 105 may specifically be 50-200 μm, for example, the extension length L1 may be 50 μm, 100 μm, 150 μm, 200 μm, etc. The protruding height h2 of the protective layer 300 along the second direction Y on the first bonding portion 104 may specifically be 60-120 μm, for example, the protruding height h2 may be 60 μm, 70 μm, 80 μm, 90 μm, 100 μm, 110 μm, 120 μm, etc.

Figure 8:
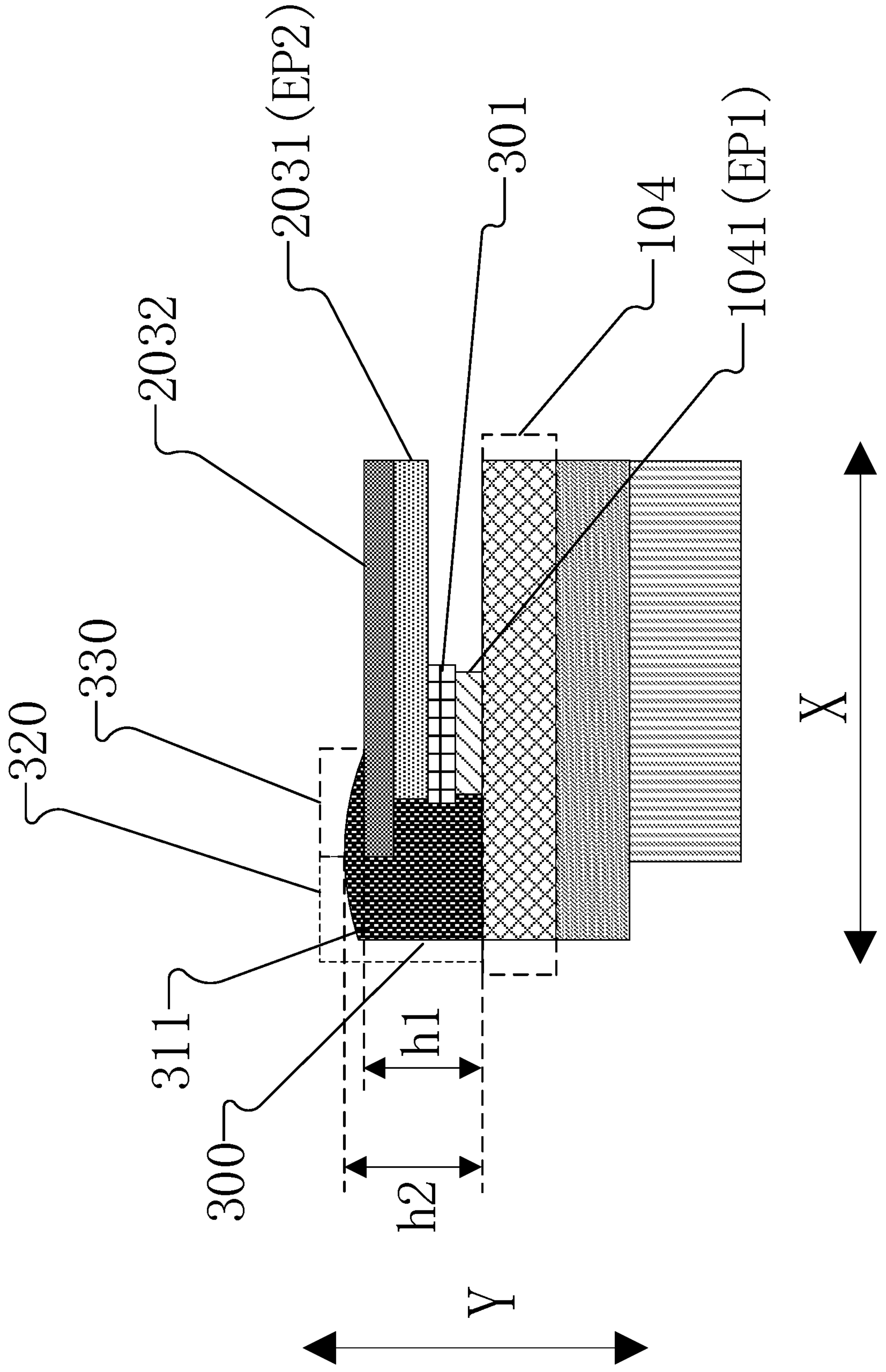

In addition, it should be noted that the protruding height h2 of the protective layer 300 may be the same as the protruding height h1 of the second bonding portion 203 as shown in FIG. 3*a*, or the protruding height h2 of the protective layer 300 may be different from the protruding height h1 of the second bonding portion 203 as shown in FIG. 8, and the present disclosure does not limit this.

In an example embodiment, after the protective layer 300 is formed, a cutting process may be carried out to simultaneously cut the protective layer 300 and the sticking-out portion 105, so that the sticking-out length of the sticking-out portion 105 can meet the requirement and the protective layer 300 completely covers the sticking-out portion 105. It can be understood that, as shown in FIG. 2, after the array substrate 100 is bent, the side wall of the sticking-out portion 105 away from the bending portion 103 and the side wall of the protective layer 300 away from the bending portion 103 are located in the same plane.

Figure 4A:
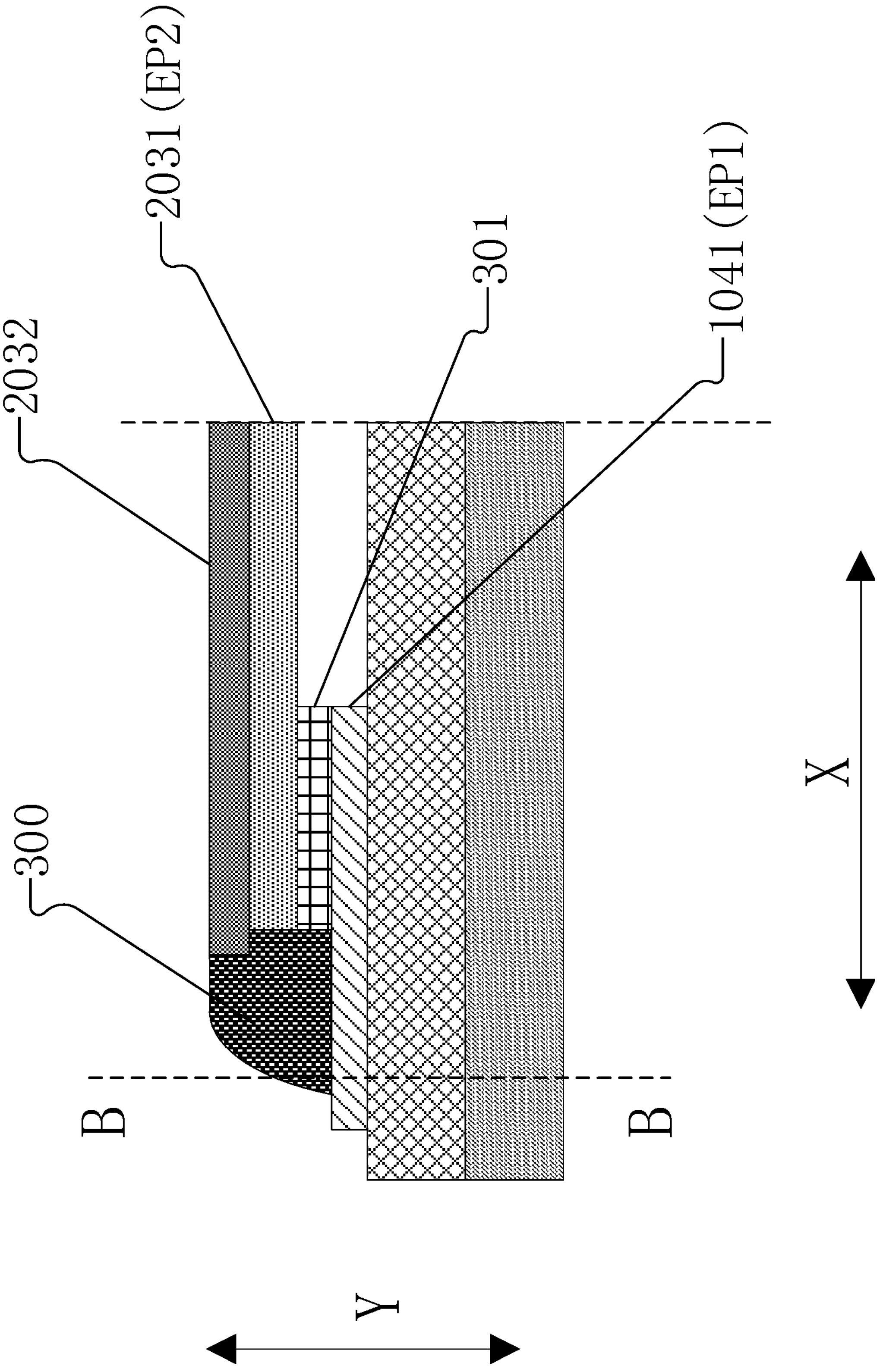
FIG. 4*a* and FIG. 4*b* are schematic structural diagrams showing a protective layer protecting an electrode according to an embodiment of the present disclosure.
Figure 4B:
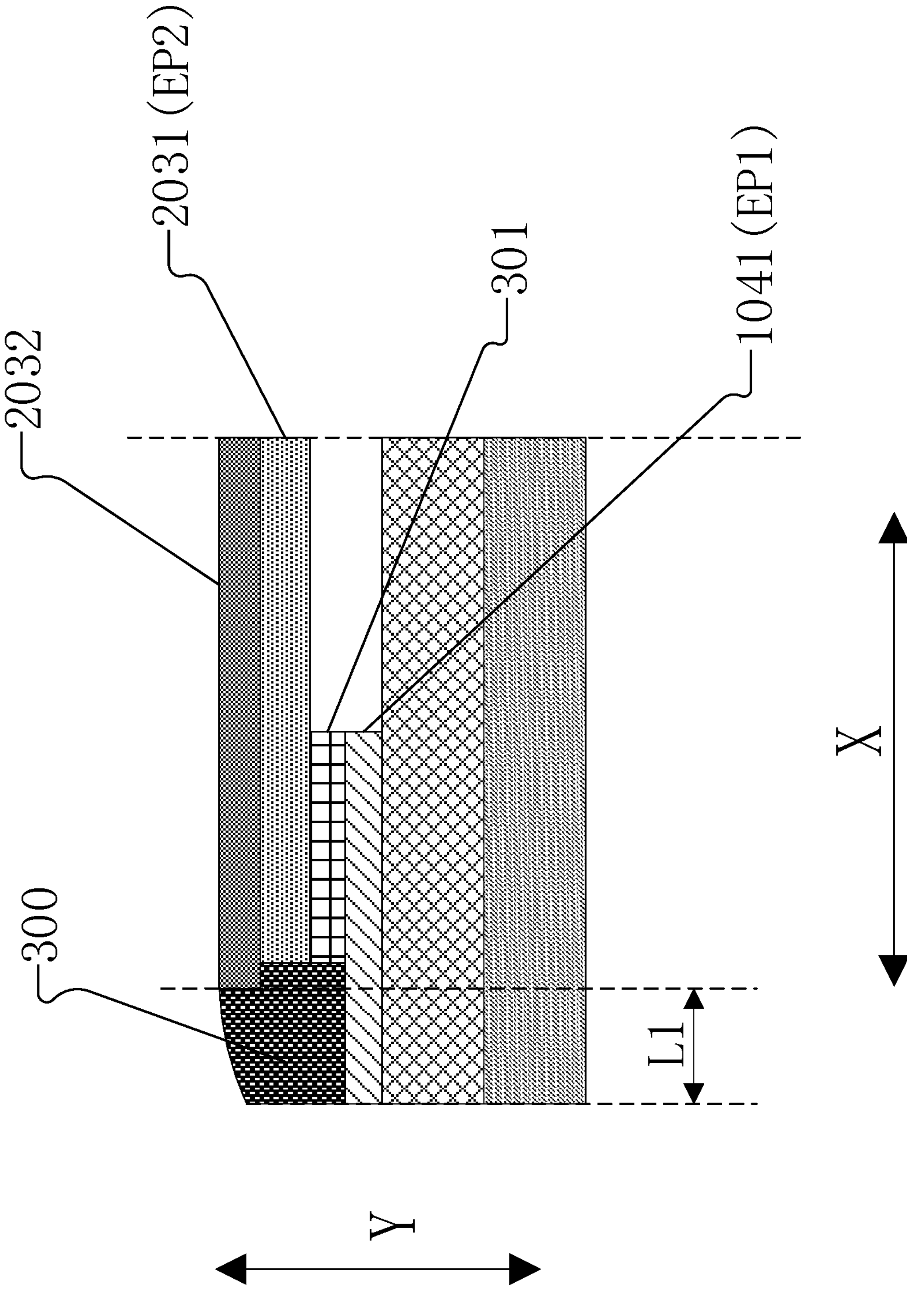

In addition, in some embodiments, as shown in FIG. 4*a*, before cutting the protective layer 300 and the sticking-out portion 105, the first bonding electrode EP1 and/or the second bonding electrode EP2 may be exposed from the protective layer 300 (in this figure, the first bonding electrode EP1 being exposed from the protective layer 300 is taken as an example for illustration). By cutting the protective layer 300 and the sticking-out portion 105, the electrode (s) not covered by the protective layer 300 may be cut off. As shown in FIG. 4*b*, the protective layer 300 completely covers the upper surface of the electrode(s) after cutting, and only the side wall part of the electrode is exposed from the protective layer 300. Since the thickness of an electrode is very small, the influence of moisture on it is very small. And because the side walls of the electrodes are against a wall of a battery compartment of the display device, the wall of the battery compartment may form a moisture barrier for the side walls of the electrodes. Therefore, by cutting off the electrodes that are exposed from the protective layer 300, the electrodes can be protected from being oxidized and corroded by moisture.

As shown in FIG. 2 and FIG. 3*a*, in an example embodiment, the second bonding portion 203 may include a second conductive layer 2031 and an insulating layer 2032. The second bonding electrode EP2 is located in the second conductive layer 2031. The second conductive layer 2031 may face the first bonding portion 104 of the array substrate 100, and the insulating layer 2032 covers the second conductive layer 2031 at a side of the second conductive layer 2031 away from the first bonding portion 104. Side walls of the second conductive layer 2031 and the insulating layer 2032 facing the protective layer 300 are all sealed and connected with the protective layer 300, thereby preventing moisture from entering the first electrode and/or the second electrode, and playing a role of isolating moisture and protecting the bonding electrodes from being oxidized and corroded. Of course, in other embodiments, the circuit board 200 may have more conductive layers and insulating layers at the second bonding portion 203, which will not be described in detail here.

As shown in FIG. 1 and FIG. 2, in an example embodiment, the array substrate 100 may include a base substrate 10, a base film 20, a first conductive layer 1041 and a third conductive layer 301. The base film 20 is located at a side of the base substrate 10 in the display portion 101, the transition portion 102 and the first bonding portion 104. The first conductive layer 1041 is located at a side of the base substrate 10 away from the base film 20 in the first bonding portion 104. The first bonding electrode EP1 is located in the first conductive layer 1041. The third conductive layer 301 is located at a side of the first conductive layer 1041 away from the base substrate 10 and is connected with the second conductive layer 2031.

An orthographic projection of the second conductive layer 2031 on the base substrate 10 may cover an orthographic projection of the first conductive layer 1041 on the base substrate 10 and an orthographic projection of the third conductive layer 301 on the base substrate 10, and the orthographic projection of the third conductive layer 301 on the base substrate 10 at least partially overlaps with the orthographic projection of the first conductive layer 1041 on the base substrate 10, so that the first conductive layer 1041, the third conductive layer 301 and the second conductive layer 2031 form a stacked structure at a side (i.e., the back of the display panel) of the base substrate 10 away from the base film 20. In this way, the first conductive layer 1041 and the second conductive layer 2031 are physically and electrically connected through the third conductive layer 301, and the first bonding electrode EP1 and the second bonding electrode EP2 are bonded. The third conductive layer 301 may be conductive adhesive, for example.

It can be understood that a side of the base film 20 away from the base substrate 10 is the back of the display panel, and a side of the base substrate 10 away from the base film 20 is the display side of the display panel. The base film 20 can protect the display portion 101, the transition portion 102 and the first bonding portion 104. In addition, the base film 20 may not be provided at a position corresponding to the bending portion 103, thereby reducing the thickness of the bending portion 103, which is beneficial to improving the flexibility of the bending portion 103.

Side walls of the first conductive layer 1041 and the third conductive layer 301 facing the protective layer 300 are all sealed and connected with the protective layer 300. Therefore, the protective layer 300 can prevent moisture from entering the bonding portions of the array substrate 100 and the circuit board 200, and can protect the first conductive layer 1041 and the third conductive layer 301 from being oxidized and corroded.

As shown in FIG. 1 and FIG. 2, in an example embodiment, the array substrate may further include a support layer 30, a first adhesive layer 40, a second adhesive layer 50 and a cover layer (not shown in the figures). The support layer 30 is located at a side of the base film 20 away from the base substrate 10 in the display portion 101 and the transition portion 102, and can play a supporting and heat dissipating role. The first adhesive layer 40 is located between the support layer 30 and the base film 20 to connect the support layer 30 and the base film 20. The second adhesive layer 50 connects the base film 20 in the first bonding portion 104 and the support layer 30 in the transition portion 102, that is, after the array substrate 100 is bent, the base film 20 in the first bonding portion 104 is connected with the support layer 30 in the transition portion 102 through the second adhesive layer 50. The cover layer is located at the side of the base substrate 10 away from the base film in the display portion 101. The material of the cover layer may be polyimide (PI), glass, etc.

It should be understood that in actual products, the array substrate 100 may also have other film layer structures, such as a driving circuit layer, an encapsulation layer, etc., which will not be described in detail here.

As shown in FIG. 3*b*, in an example embodiment, the interface between the first bonding portion 104 and the bending portion 103 is the first interface S1, and the insulating layer 2032 has a protruding portion 2034 at an end where the second bonding electrode EP2 is connected with the first bonding electrode EP1. In the first direction X, a distance L2 between an end of the protruding portion 2034 away from the first interface S1 and a plane where the first interface S1 is located is later than a distance L3 between an end of the second conductive layer 2031 away from the first interface S1 and the plane where the first interface S1 is located. The protective layer 300 is sealed and connected with a side of the protruding portion 2034 facing the transition portion 102. The insulating layer 2032 has a protruding portion 2034 at the end where the second bonding electrode EP2 is connected to the first bonding electrode EP1, indicating that the insulating layer 2032 extends further than the second conductive layer 2031 in a direction away from the bending portion 103. Therefore, the distance L2 in the first direction X between the protruding portion 2034 and a plane where the first interface S1 is located is later than the distance L3 in the first direction X between the second conductive layer 2031 and the plane where the first interface S1 is located. In other words, at the end where the second bonding electrode EP2 is connected with the first bonding electrode EP1, the side wall of the insulating layer 2032 is farther from the plane where the first interface S1 is located than the side wall of the second conductive layer 2031.

The protective layer 300 and the side of the protruding portion 2034 facing the transition portion 102 are sealed and connected, thereby preventing moisture from entering through the contact interface between the protective layer 300 and the insulating layer 2032 and causing the electrodes to be oxidized and corroded.

As mentioned above, a side of the sticking-out portion 105 away from the bending portion 103 has a second side wall which is opposite to the first interface S1 in the first direction X, as shown in FIG. 3*a*. In an example embodiment, in a case where the insulating layer 2032 includes the protruding portion 2034, the extension length L1 of the sticking-out portion 105 of the first bonding portion 104 in the first direction X may also be understood as a distance in the first direction X between the second side wall of the sticking-out portion 105 and a side wall of the insulating layer 2032 facing a plane where the second side wall is located.

Figure 5:
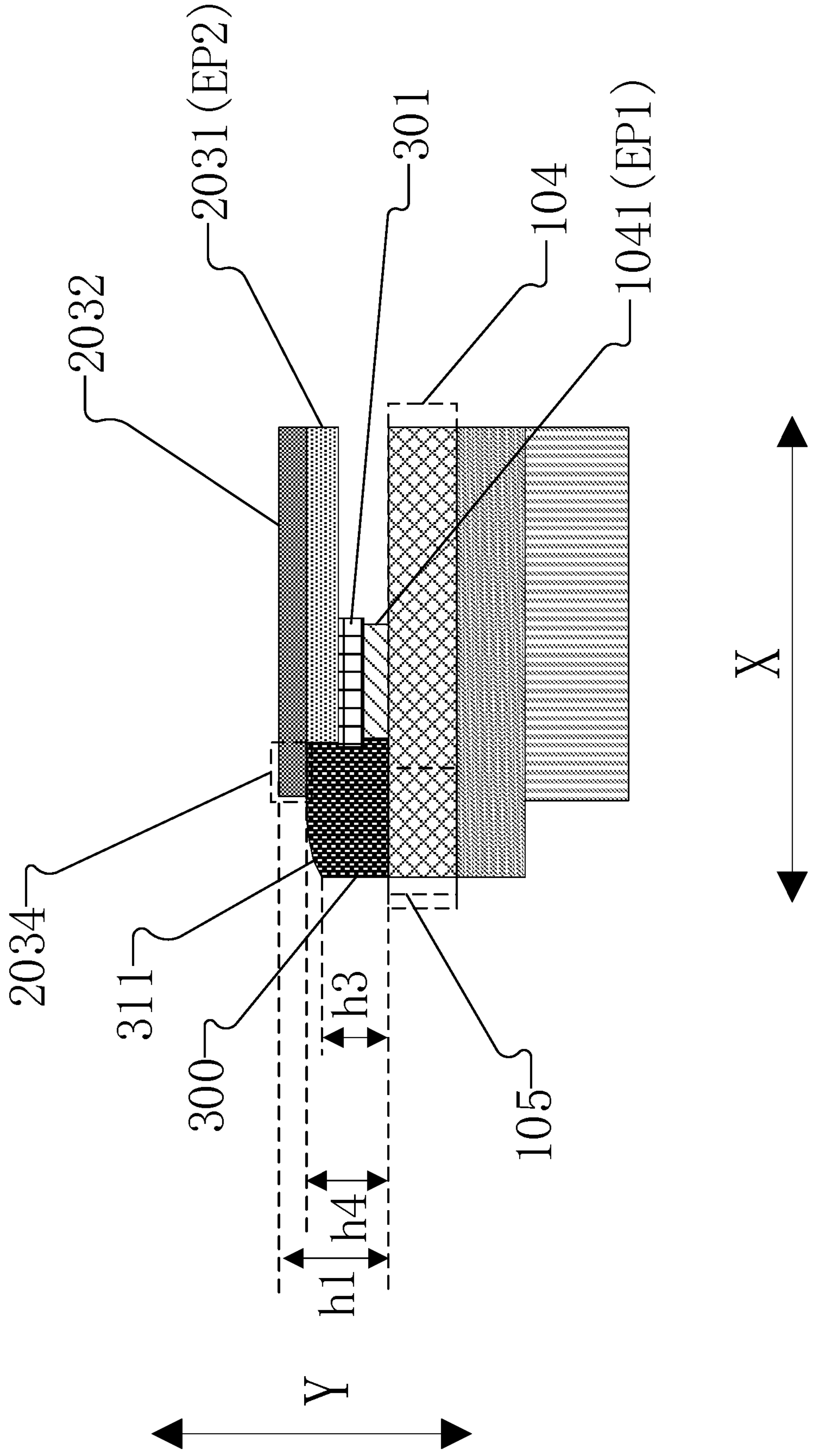
FIG. 5 to FIG. 9 are schematic structural diagrams of example structures of the protective layer in bonding provided by embodiments of the present disclosure.
Figure 6:
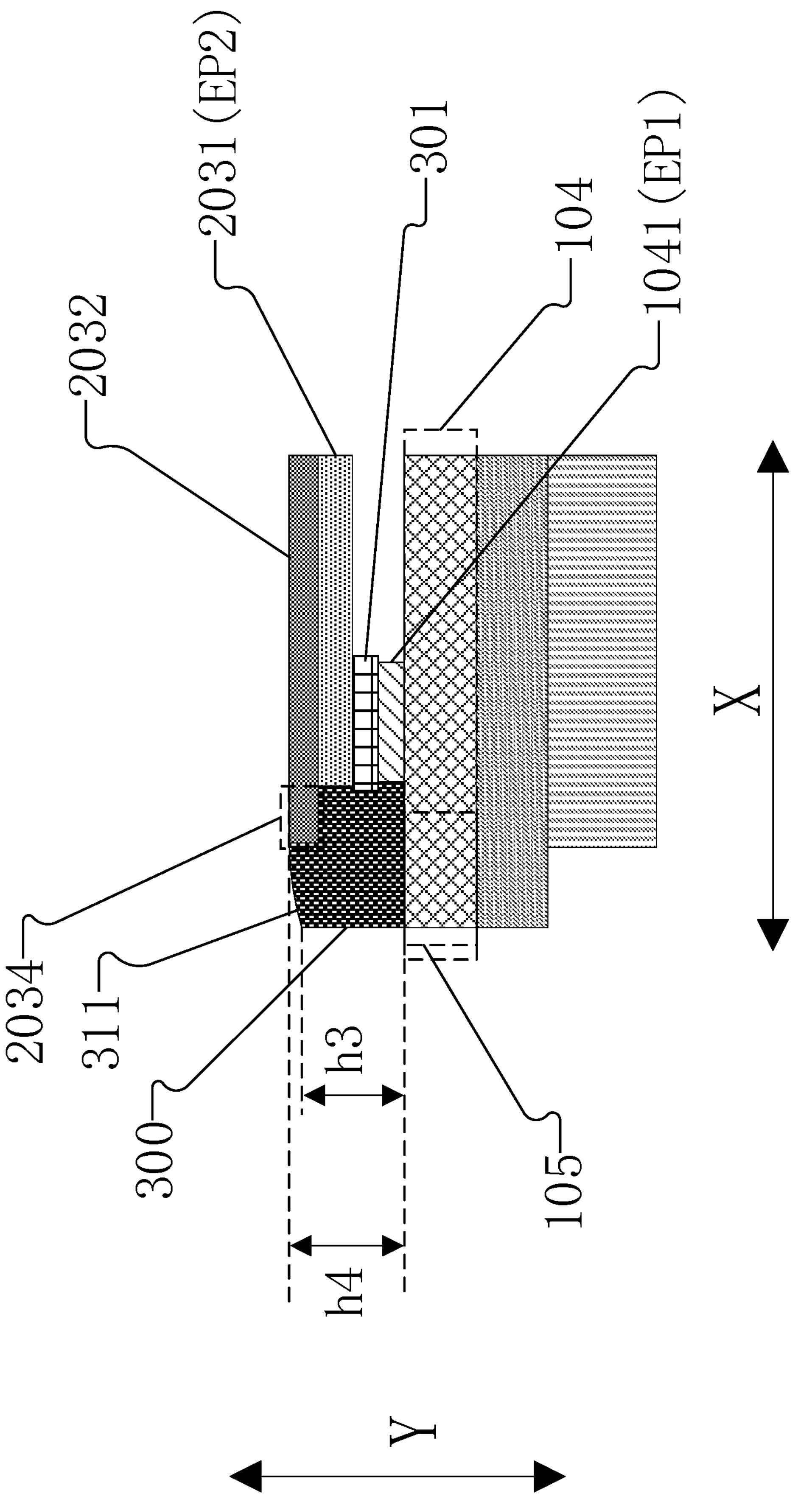
Figure 7:
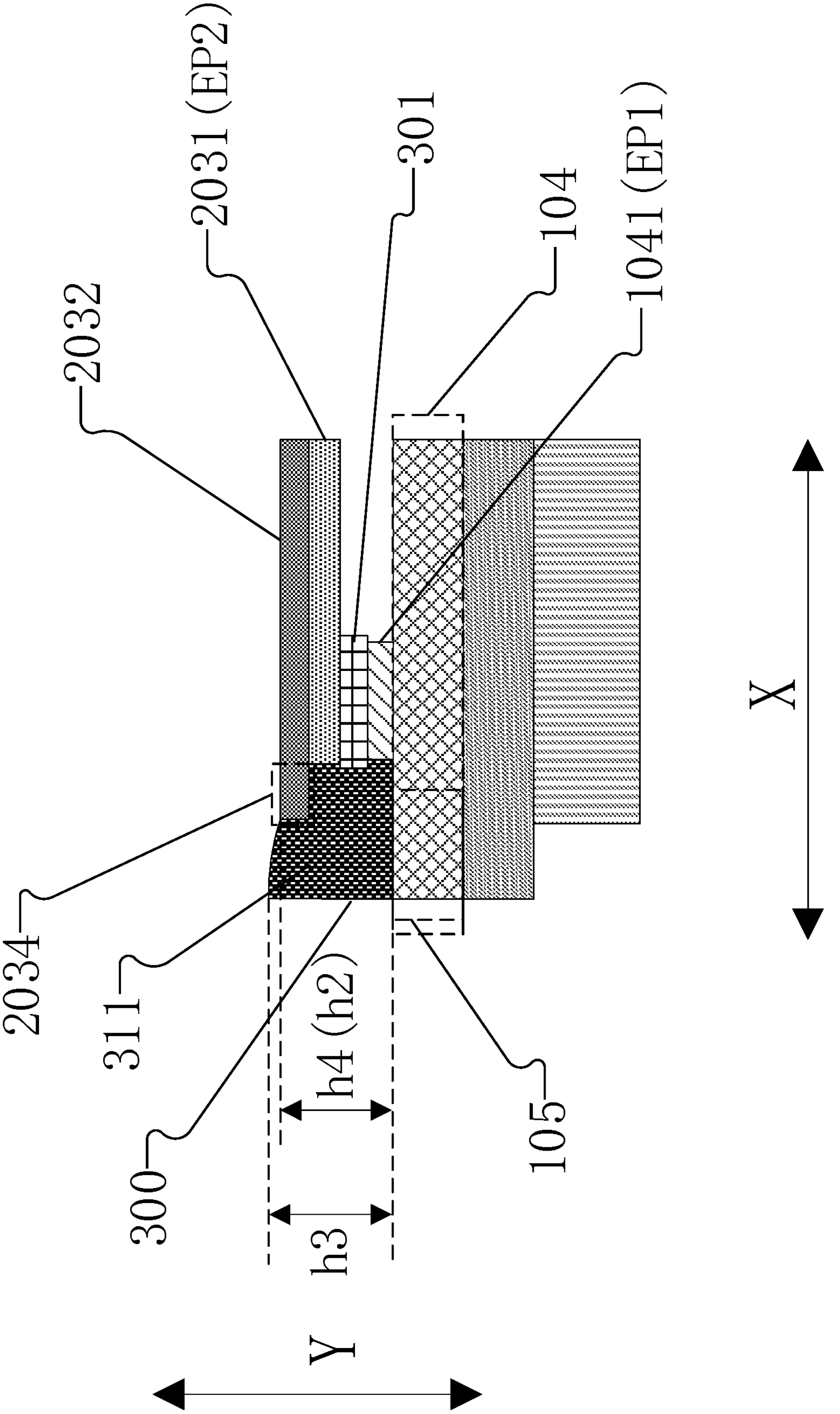

Referring to FIG. 5 to FIG. 8, in an example embodiment, the surface of the side of the protective layer 300 away from the base substrate 10 is a slope surface 311. The slope surface 311 may form a climbing structure from a first end to a second end, as shown in FIGS. 5 and 6. That is, the protruding height h3 of the first end on the first bonding portion 104 is lower than the protruding height h4 of the second end on the first bonding portion 104. Alternatively, a downslope structure can be formed from the first end to the second end, as shown in FIG. 7. That is, the protruding height h3 of the first end on the first bonding portion 104 is higher than the protruding height h4 of the second end on the first bonding portion 104. Alternatively, as shown in FIG. 8, a structure with both climbing and downslope structures can be formed from the first end to the second end. That is, the protruding height of the slope surface 311 on the first bonding portion 104 is up and down from the first end to the second end. The first end of the slope surface 311 described here is an end of the slope surface 311 away from the first interface S1, and the second end of the slope surface 311 is an end of the slope surface 311 close to the first interface S1.

In an example embodiment, as shown in FIG. 5, the side wall of the protective layer 300 facing the second bonding portion 203 exposes a side wall of the protruding portion 2034, that is, the side wall of the insulating layer 2032 facing the protective layer 300 is not in contact with the protective layer 300. In this structure, the protective layer 300 can extend from an edge at the junction of the side wall of the protruding portion 2034 and a lower surface to the first conductive layer 1041, the second conductive layer 2031 and the third conductive layer 301 to expose the side wall of the insulating layer 2032, and the protective layer 300 is sealed and connected with the bottom of the protruding portion 2034. Furthermore, in this example embodiment, when the slope surface 311 forms a climbing structure from the first end to the second end as shown in FIG. 5, the slope angle of the slope surface 311 may be less than or equal to 60°, for example, the slope angle may be 20°, 30°, 45°, 60°, etc. In this example embodiment, by setting the angle of the slope surface 311 of the protective layer 300 as the above range, the purpose is to reduce the climbing angle of the slope surface 311 and control the slope surface 311 not to be too steep, thereby avoiding a problem that after being used for a period of time, the protective layer 300 is not tightly attached to the insulating layer 2032 of the circuit board 200 and moisture may enter and corrode the electrodes. This arrangement can increase the service life of the display panel.

The slope angle of the slope surface 311 described in the present disclosure can be understood as an acute angle between a tangent plane passing through any point on the slope surface 311 and the plane where the array substrate 100 is located.

Figure 9:
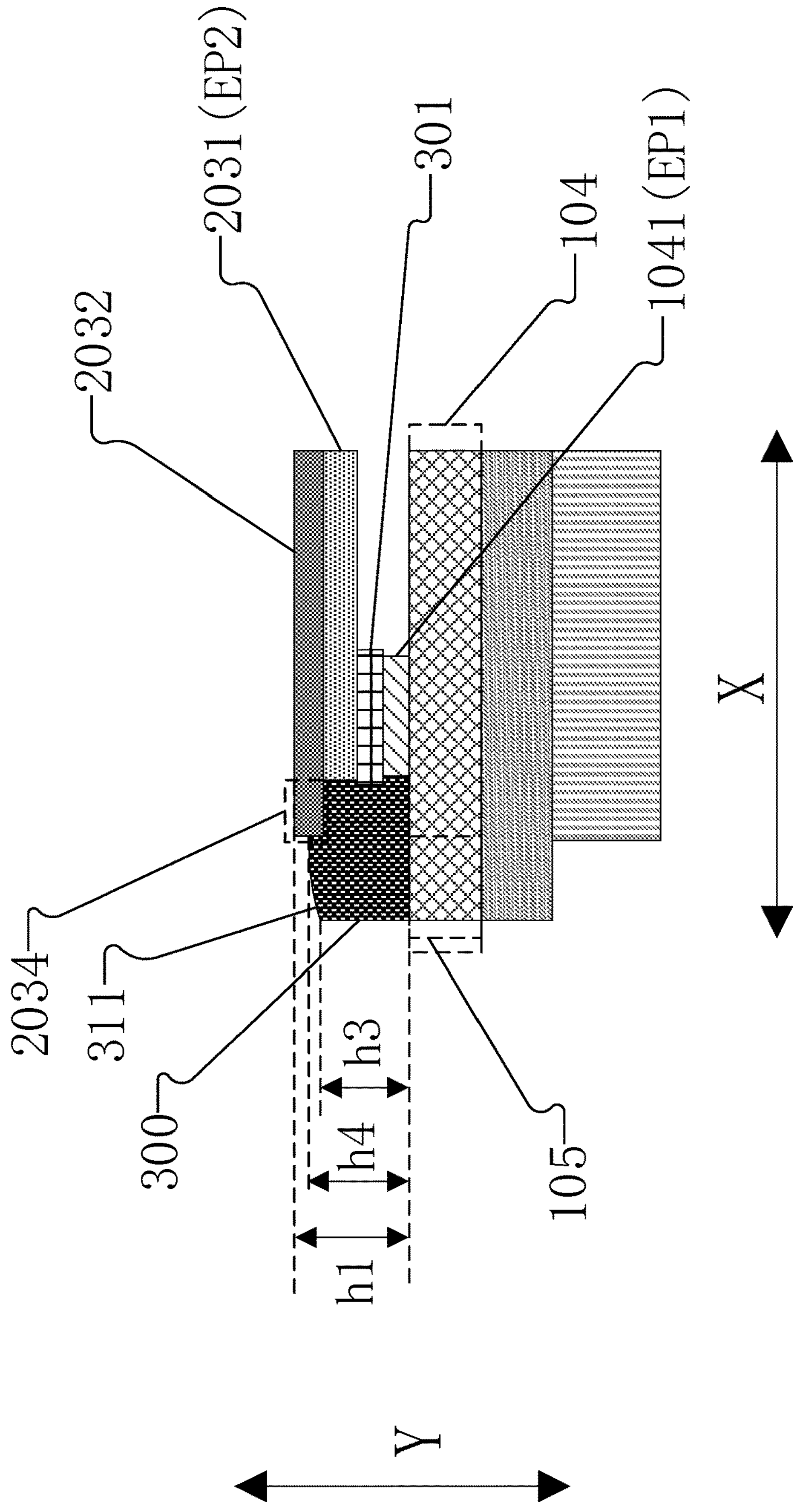

In another example embodiment, as shown in FIG. 9, the side wall of the protective layer 300 facing the second bonding portion 203 exposes a part of the side wall of the protruding portion 2034. That is, a part of the side wall of the protruding portion 2034 is in contact with the side wall of the protective layer 300. The side wall of the protruding portion 2034 is a side wall in the first direction X away from the bending portion 103.

In yet another example embodiment, as shown in FIG. 6 and FIG. 7, the side wall of the protective layer 300 facing the second bonding portion 203 is sealed and connected with the side wall of the protruding portion 2034. That is, the side wall of the protruding portion 2034 completely fits the side wall of the protective layer 300. For example, the protective layer 300 can be formed by coating UV adhesive. In this case, UV adhesive is not only coated on the side walls of the first conductive layer 1041, the second conductive layer 2031 and the third conductive layer 301, but also needs to be coated on the side wall of the insulating layer 2032 away from the bending portion 103, so that the protective layer 300 forms the structure shown in FIG. 6 and FIG. 7.

In yet another example embodiment, as shown in FIG. 8, the protective layer 300 may have a main extension portion 320 and a secondary extension portion 330. The main extension portion 320 covers the sticking-out portion 105 and the secondary extension portion 330 covers the insulating layer 2032. That is, the orthographic projection of the secondary extension portion 330 on the base substrate 10 is located on the insulating layer 2032, and the orthographic projection of the main extension portion 320 on the base substrate 10 is located on the sticking-out portion 105. The present disclosure does not limit the extension length of the secondary extension portion 330 on the upper surface of the insulating layer 2032, and the extension length can be specifically set according to user needs. For example, the extension length of the secondary extension portion 330 may be less than or equal to 100 μm. The upper surface of the insulating layer 2032 mentioned here refers to the surface of a side of the insulating layer 2032 away from the second conductive layer 2031.

Figure 10:
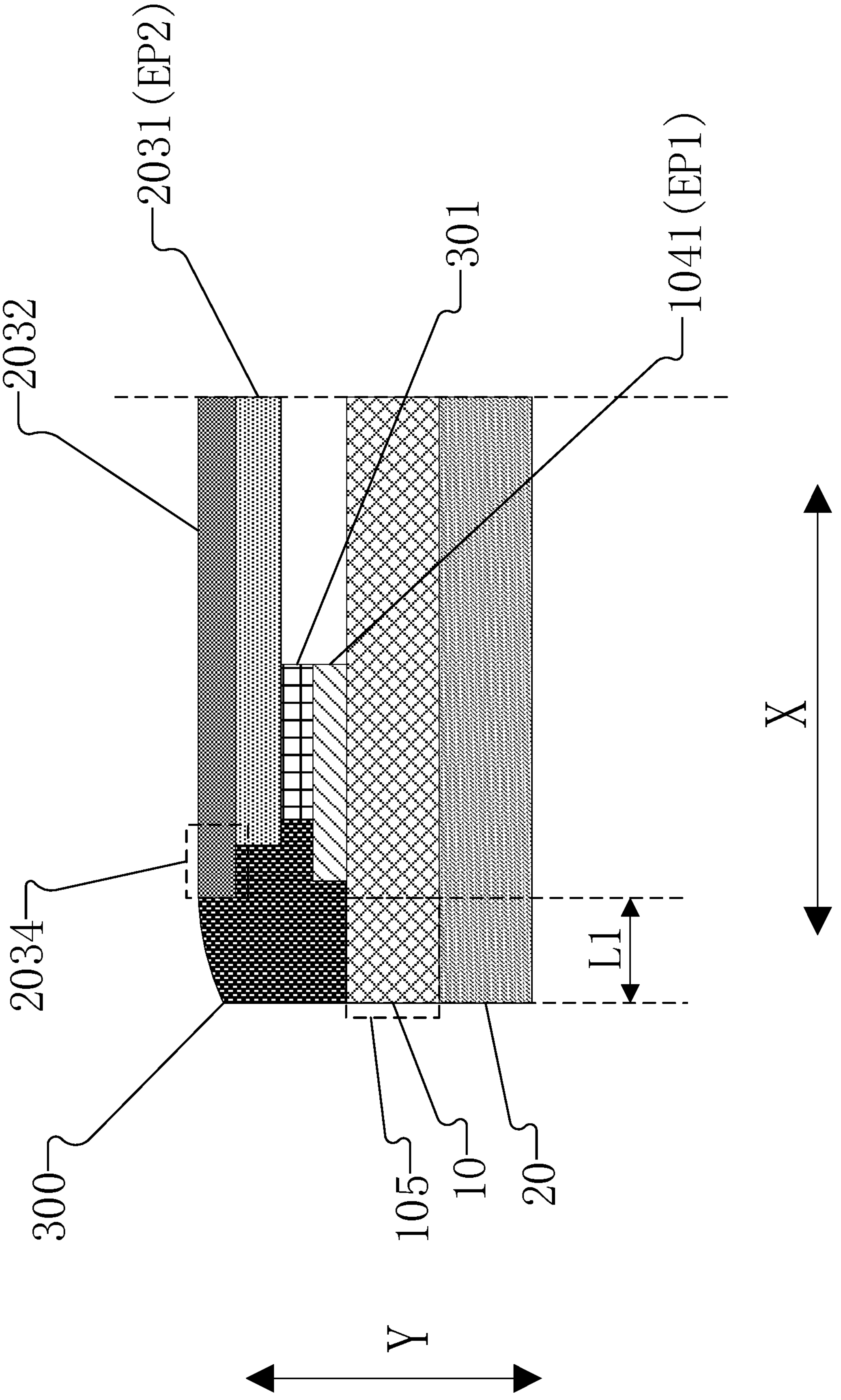
FIG. 10 is a schematic structural diagram of a bonding portion according to another embodiment of the present disclosure.

It should be noted that the above-mentioned embodiments of the present disclosure are described by taking an example where the distance in the first direction X between the second bonding electrode EP2 and the plane where the first interface S1 is located is larger than the distance in the first direction X between the first bonding electrode EP1 and the plane where the first interface S1 is located, that is, the second bonding electrode EP2 is further from the plane where the first interface S1 is located in the first direction X than the first bonding electrode EP1. In other embodiments of the present disclosure, as shown in FIG. **4*b* and FIG. 10, the distance in the first direction X between the second bonding electrode EP2 and the plane where the first interface S1 is located may be smaller than the distance in the first direction X between the first bonding electrode EP1 and the plane where the first interface S1 is located, that is, the second bonding electrode EP2 is closer to the display portion 101 in the first direction X than the first bonding electrode EP1**.

As shown in FIG. 2 and FIG. **3*a*, in an example embodiment, the thickness d1 of the body portion 201 of the circuit board 200 in the second direction Y is larger than the thickness d2 of the second bonding portion 203 in the second direction Y For example, the thickness d1 of the body portion 201 in the second direction Y may be larger than or equal to 120 μm, and the thickness d2 of the second bonding portion 203 in the second direction Y may be 40~60 μm. Here, the thickness of the body portion 201 of the circuit board 200 in the second direction Y can be understood as: the body portion 201 has an upper surface away from the first bonding portion 104 and a lower surface facing the first bonding portion 104, and a distance between the upper surface and the lower surface in the second direction Y is the thickness of the body portion 201 in the second direction Y Similarly, the thickness d2 of the second bonding portion 203 in the second direction Y is a distance in the second direction Y between an upper surface of the second bonding portion 203 away from the first bonding portion 104 and a lower surface facing the first bonding portion 104. For example, the circuit board 200 may have a single-layer structure at the second bonding portion 203, that is, it may include only one conductive layer in addition to the base material layer. The body portion 201 of the circuit board 200** may have a multi-layer structure, for example, in addition to a base material layer, it may also include six conductive layers and interlayer insulating layers stacked at a side of the base material layer.

In addition, the display panel may further include a chip IC. The chip IC is bonded to the first bonding portion 104. The chip IC and the circuit board 200 are located at the same side of the array substrate 100. The chip IC is connected to the second bonding electrode EP2 through the first bonding electrode EP1, so that the chip IC is electrically connected to an external device through the circuit board 200. Correspondingly, the body portion 201 of the circuit board 200 has an open groove 204 which opens up toward the first bonding portion 104, and the open groove 204 is used to accommodate the chip IC.

As shown in FIG. 2, in an example embodiment, the body portion 201 of the circuit board 200 may include an electronic device 205 at a side away from the first bonding portion 104, the electronic device 205 is connected with the body portion 201, and an orthographic projection of the electronic device 205 on the first bonding portion 104 may be separated from an orthographic projection of the open groove 204 on the first bonding portion 104. That is, the electronic device 205 is not provided in the part of the body portion 201 above the open groove 204. In other words, the electronic device 205 avoids an area which is above the open groove 204 and is directly opposite to the open groove 204. In this way, no additional wiring is formed at the position of the body portion 201 corresponding to the open groove 204, thereby not affecting the shape of the body portion 201 above the open groove 204, and ensuring the stable operation of the chip IC.

It should be understood that the depth of the open groove 204 is slightly larger than the height of the chip IC, so that the open groove 204 can accommodate the chip IC. In an example embodiment, the depth d3 of the open groove 204 in the second direction Y may be larger than or equal to 200 μm to provide sufficient space for the chip IC.

In an example embodiment, the open groove 204 may be a through hole, that is, the open groove 204 penetrates the body portion 201 in the second direction Y And, in this structure, the height of the chip IC in the through hole may be larger than the thickness d1 of the body portion 201 in the second direction Y It can be understood that when the open groove 204 is a through hole, the depth of the open groove 204 is the thickness of the body portion 201.

In addition, it should be understood that when the open groove 204 is included, the thickness d1 of the body portion 201 of the circuit board in the second direction Y refers to a thickness of a peripheral portion of the body portion 201 surrounding the open groove 204 in the second direction Y.

Figure 11:
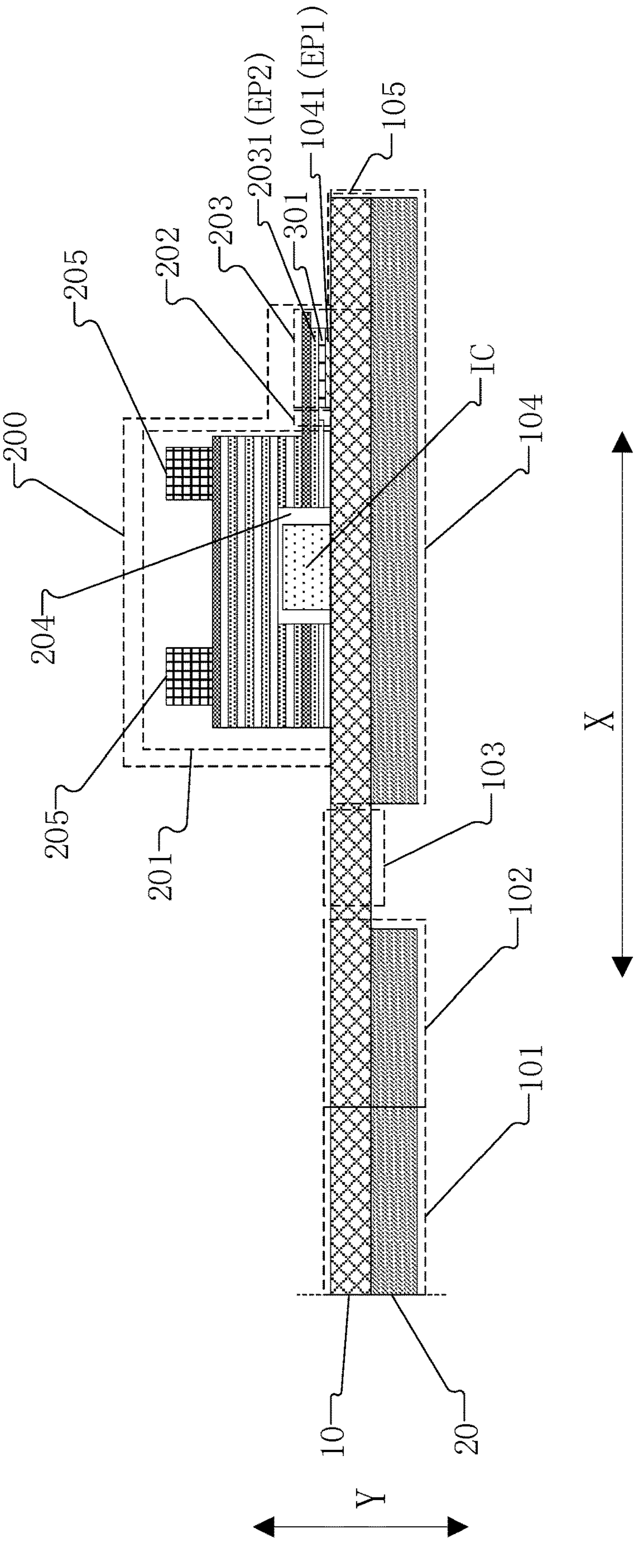
FIG. 11 to FIG. 15 are flowcharts of manufacturing processes of a display panel according to an embodiment of the present disclosure.

The present disclosure also provides a method for preparing a display panel. The method is used to prepare the display panel according to any embodiment of the present disclosure. The preparation method may include the following steps:

In S110, as shown in FIG. 11, an array substrate 100 and a chip IC are provided. The array substrate 100 includes a display portion 101, and a transition portion 102, a bending portion 103 and a first portion which are connected in sequence at an end of the display portion 101. The first bonding portion 104 has a first bonding electrode EP1 at an end of the first bonding portion 104 away from the bending portion 103. The chip IC is bonded to the first bonding portion 104.

The array substrate 100 may be a flexible array substrate 100. The array substrate 100 may include a base substrate 10, abase film 20, a first conductive layer 1041 and a third conductive layer 301. The base film 20 is located at a side of the base substrate 10 in the display portion 101, the transition portion 102 and the first bonding portion 104. The first conductive layer 1041 is located at a side of the base substrate 10 away from the base film 20 in the first bonding portion 104. The first bonding electrode EP1 is located in the first conductive layer 1041. The third conductive layer 301 is located at a side of the first conductive layer 1041 away from the base substrate 10 and is connected with the second conductive layer 2031.

It is worth noting that the present disclosure performs reverse bonding of the IC, and the chip IC is located at the side of the array substrate 100 away from the base film 20 in the bonding portion. As shown in FIG. 11, the chip IC is raised to a certain height on the first bonding portion 104 of the array substrate 100. On this basis, before the circuit board 200 is reversely bonded, an open groove 204 is formed in the body portion 201. The open groove 204 opens toward the base substrate 10, and the depth of the open groove 204 is larger than the height of the chip IC, and the width of the open groove 204 is larger than the width of the chip IC, so that the chip IC is accommodated by the open groove 204 after the body portion 201 is reversely bonded.

In S120, as shown in FIG. 11, a circuit board 200 is provided. The circuit board 200 includes a body portion 201 and a second bonding portion 203. An end of the second bonding portion 203 away from the body portion 201 has a second bonding electrode EP2.

In S130, as shown in FIG. 11, the second bonding electrode EP2 is bonded to the first bonding electrode EP1, and the body portion 201 and the chip IC are located at the same side of the second bonding portion 203 in the first direction X. The first bonding portion 104 has an sticking-out portion 105 at an end where the first bonding electrode EP1 is connected with the second bonding electrode EP2, and the sticking-out portion 105 extends in the first direction X. The first direction X is perpendicular to the interface between the display portion 101 and the bending portion 103, and the second direction Y is perpendicular to the plane where the array substrate 100 is located.

The circuit board 200 may be, for example, a flexible circuit board 200. The circuit board 200 and the first bonding portion 104 of the array substrate 100 are stacked at the non-display side of the display portion 101, thereby saving the space of back of the array substrate 100 in the first direction X by utilizing the space of the array substrate 100 in the second direction X. The saved space can be used to increase the battery compartment space of the display device, thereby increasing the battery capacity of the display device.

In an example embodiment, an electronic device 205 connected to the body portion 201 may be formed on the body portion 201 of the circuit board 200. Specifically, an electronic device 205 may be formed at both sides of the body portion 201 around the open groove 204 along the first direction X. That is, the electronic devices 205 on the body portion 201 avoid an area which is directly opposite to the open groove 204, thereby ensuring the shape of the open groove 204, ensuring the stable operation of the chip IC, and extending the service life of the display panel.

Figure 12:
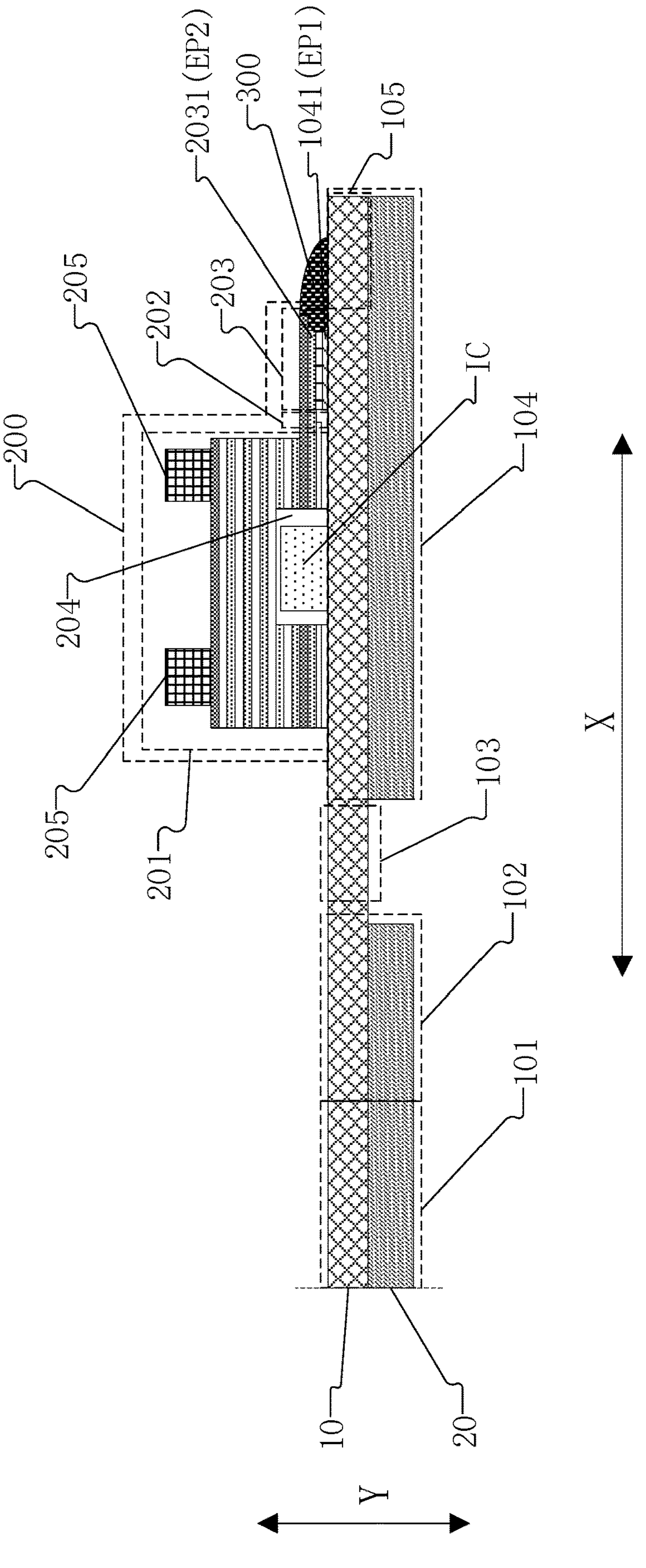

In some embodiments, as shown in FIG. 12, after step S130, the preparation method may further include: forming a protective layer 300 at a side of the sticking-out portion 105. The protective layer 300 is connected to the first bonding electrode EP1 and the second bonding electrode EP2. For example, UV adhesive may be applied to an end of the first bonding portion 104 that protrudes from the second bonding portion 203 to form the protective layer 300. The protective layer 300 can isolate the first bonding electrode EP1 and the second bonding electrode EP2 from external environment, thereby preventing moisture from entering the bonding portions of the array substrate 100 and the circuit board 200, and protecting the bonding electrodes from being oxidized and corroded by moisture.

Figure 13:
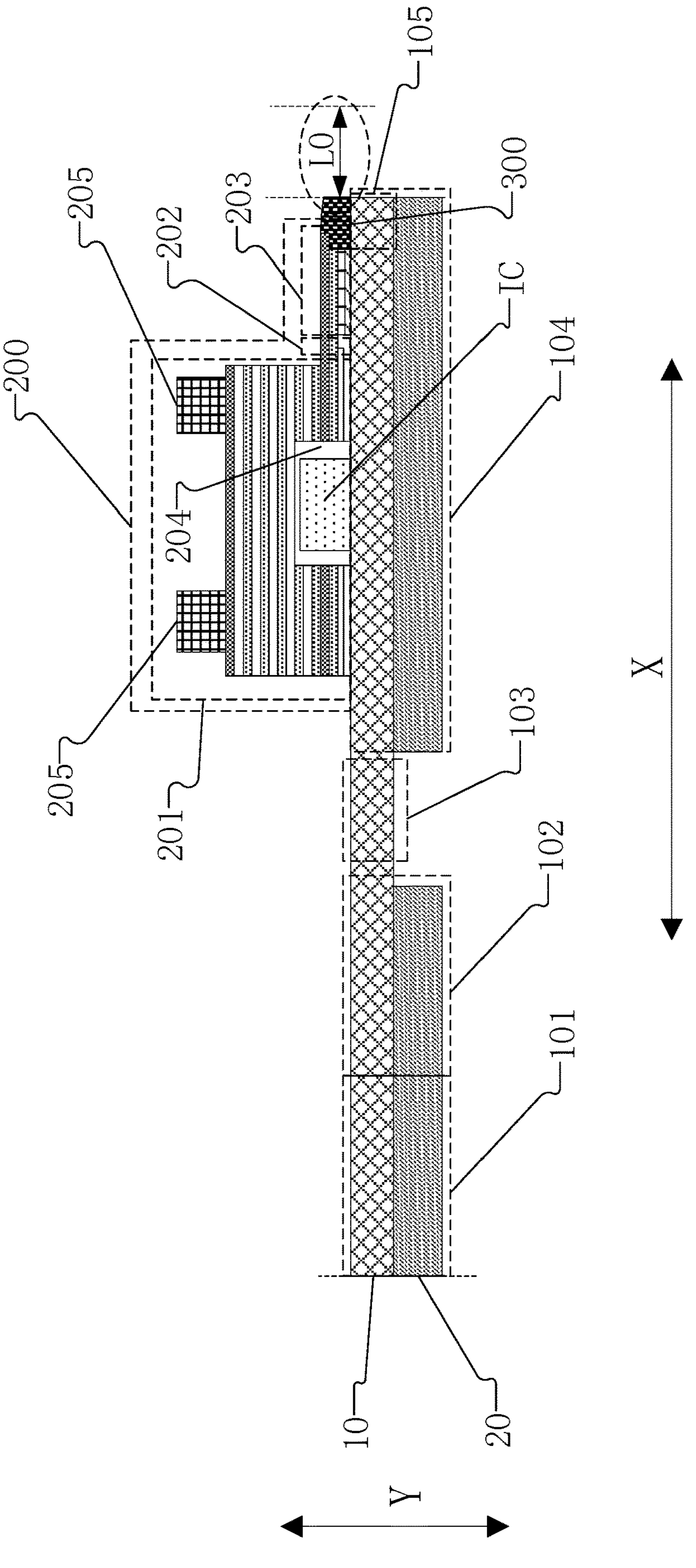

In S140, as shown in FIG. 13, a cutting process is used to cut the sticking-out portion 105. The extension length of the sticking-out portion 105 in the first direction X after cutting is L1, and the protruding height of the second bonding portion 203 on the first bonding portion 104 along the second direction Y is h1, and the ratio of L1 to h1 is larger than or equal to 0.4 and less than or equal to 3.5.

In an example embodiment, a laser process may be used to cut the sticking-out portion 105, so that the extension length L1 of the sticking-out portion 105 in the first direction X meets a requirement.

As mentioned above, after step S130, it is usually needed to form the protective layer 300 on the sticking-out portion 105. Therefore, this step may be using a cutting process to cut the protective layer 300 and the sticking-out portion 105, so that the protective layer 300 after cutting covers the sticking-out portion 105 after cutting.

Comparing FIG. 12 and FIG. 13, it can be seen that after cutting, the length of the sticking-out portion 105 is shortened by L0, and this area is the battery compartment space that can be increased. Correspondingly, the battery capacity can be further improved.

It can be known that before forming a display panel, shape cut needs to be performed on the array substrate 100. In an example embodiment, the sticking-out portion 105 and the protective layer 300 may be cut simultaneously during the cutting process in shape cut of the substrate. This can save process steps, improve production efficiency and reduce production costs.

Figure 14:
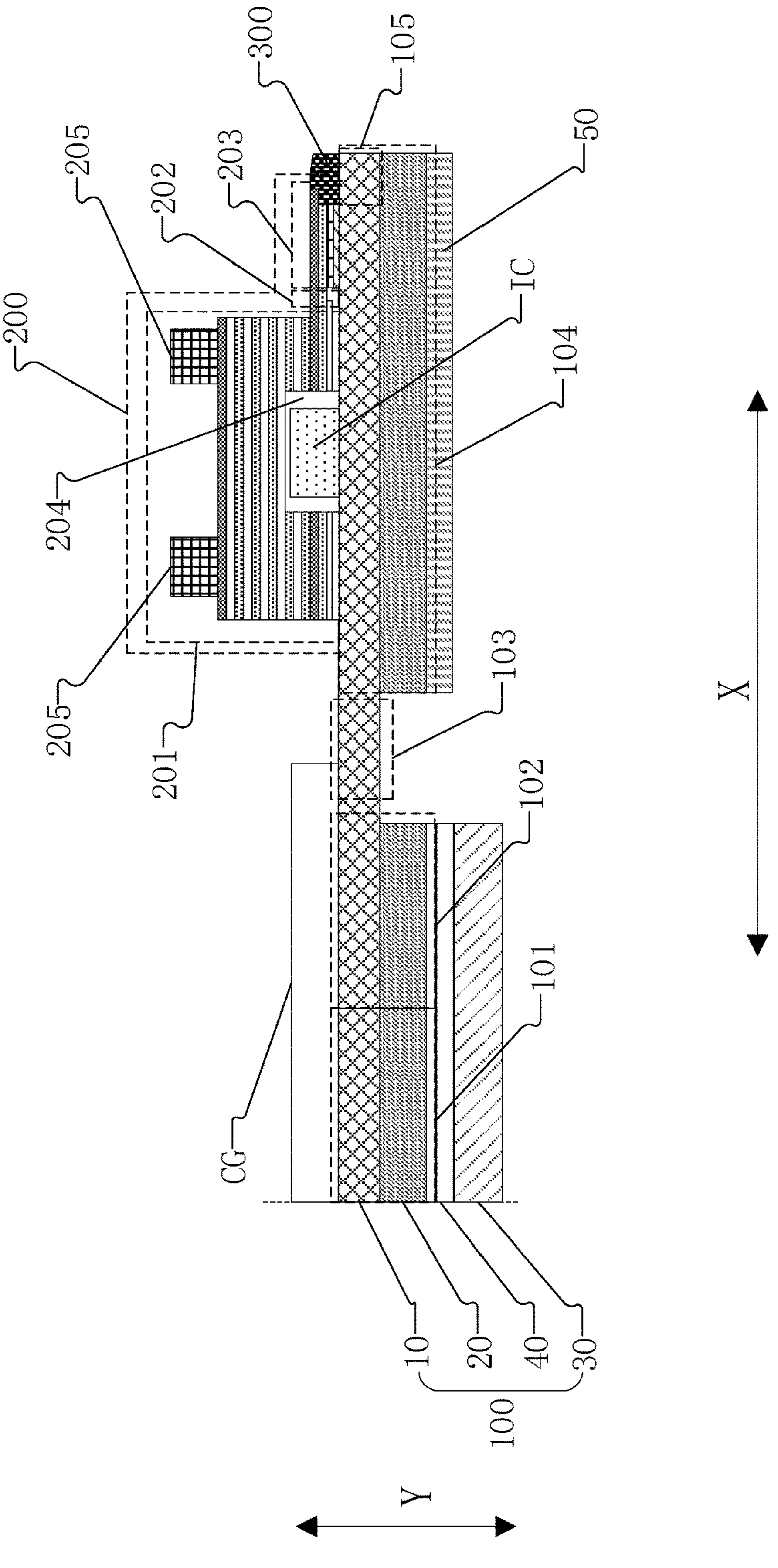

In an example embodiment, as shown in FIG. 14, after cutting the sticking-out portion 105 and the protective layer 300, the preparation method may further include:

- forming a first adhesive layer 40 at a side of the base film 20 away from the base substrate 10;
- forming a support layer 30 in the display portion 101 and the transition portion 102 at a side of the first adhesive layer 40 away from the base substrate 10, where the support layer 30 may play a role of supporting and dissipating heat, and the support layer 30 and the base film 20 are connected through the first adhesive layer 40;
- forming a second adhesive layer 50 in the first bonding portion 104 at a side of the base film 20 away from the base substrate 10, where the second adhesive layer 50 can be connected with the base film 20 in the first bonding portion 104 and the support layer 30 in the transition portion 102 after the array substrate 100 is bent; and
- forming a cover layer CP in the display portion 101 at a side of the base substrate 10 away from the base film 20.

Figure 15:
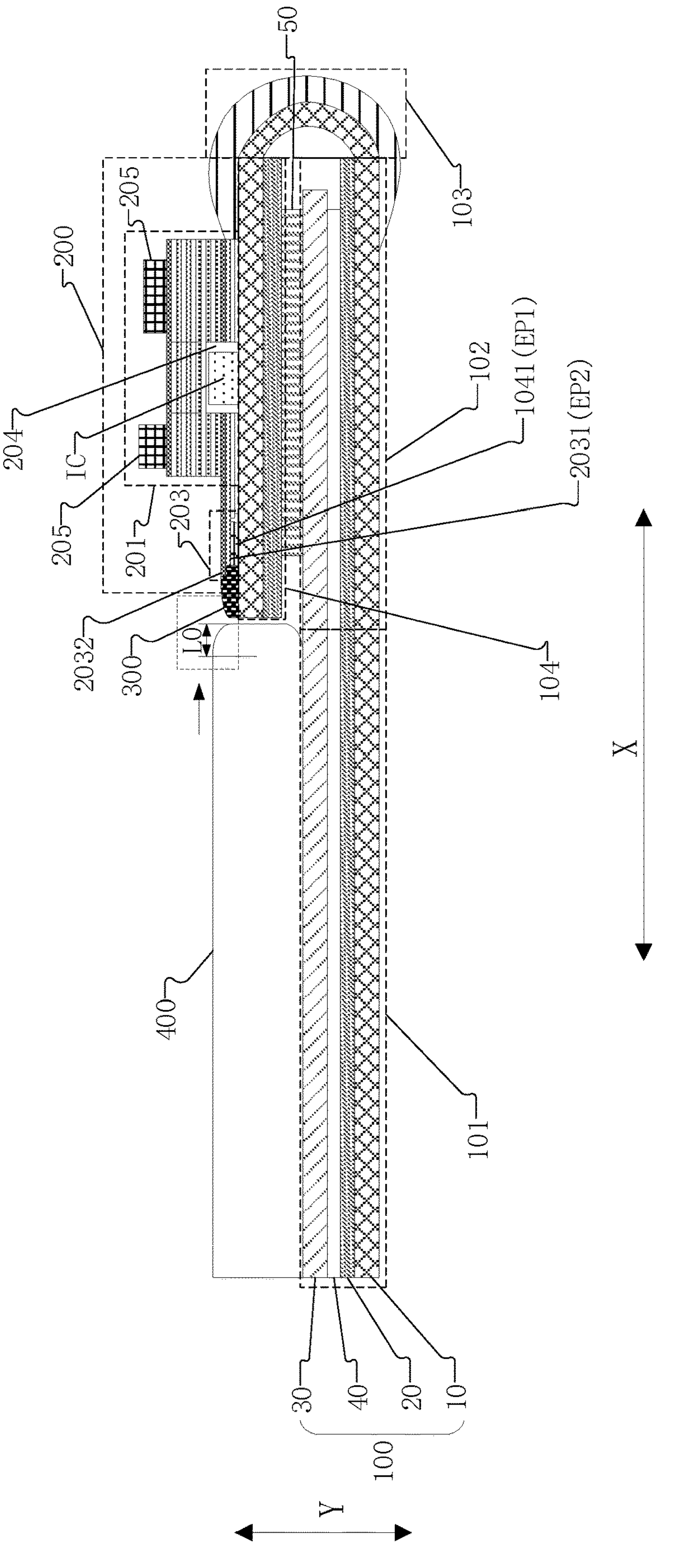

In S150, as shown in FIG. 15, the bending portion 103 is bent to bend the first bonding portion 104 to the non-display side of the display portion 101. It can be seen that after bending, the first bonding portion 104 faces the battery compartment 400 on the back of the display panel. Because the protective layer 300 is cut, compared with the existing technology, the size of the battery compartment 400 can be extended by a length of L0 along a direction indicated by an arrow in the figure, thereby further increasing the size of the battery compartment 400.

Other embodiments of the disclosure will be readily apparent to those skilled in the art from consideration of the specification and practice of the invention disclosed herein. The present disclosure is intended to cover any variations, uses, or adaptations of the disclosure that follow the general principles of the disclosure and include common sense or customary technical means in the technical field that are not disclosed in the disclosure.

What is claimed is:

1. A display panel, comprising:

an array substrate comprising a display portion, a transition portion, a bending portion and a first bonding portion, wherein the transition portion is connected to an end of the display portion, the transition portion is between the display portion and the bending portion, and the bending portion is between the transition portion and the first bonding portion, wherein an end of the first bonding portion away from the bending portion has a first bonding electrode, and the first bonding portion is bent to a non-display side of the display portion through the bending portion;

a chip bonded to the first bonding portion; and a circuit board comprising a body portion and a second bonding portion, wherein an end of the second bonding portion away from the body portion has a second bonding electrode, the second bonding electrode is connected to the first bonding electrode, and the body portion and the chip are located at a same side of the second bonding portion in a first direction, and the first direction is parallel with a plane where the display portion is located;

wherein the first bonding portion has a sticking-out portion at an end of the first bonding electrode connected to the second bonding electrode, the sticking-out portion extends along the first direction, the second bonding portion exposes the sticking-out portion in a second direction, and the second direction is perpendicular to a plane where the array substrate is located;

wherein an extension length of the sticking-out portion in the first direction is L1, and a protruding height of the second bonding portion on the first bonding portion along the second direction is h1, and a ratio between L1 and h1 is larger than or equal to 0.4 and less than or equal to 3.5.

2. The display panel according to claim 1, wherein an interface between the first bonding portion and the bending portion is a first interface, and the display panel further comprises:

a protective layer located at a side of the first bonding portion away from the transition portion and covering at least the sticking-out portion, wherein a distance in the first direction between a side wall of the protective layer away from the bending portion and a plane where the first interface is located is equal to a distance in the first direction between an end of the sticking-out portion and the plane where the first interface is located, and the protective layer is connected to the first bonding electrode and the second bonding electrode.

3. The display panel according to claim 2, wherein a protruding height of the protective layer on the first bonding portion along the second direction is h2, and a ratio between L1 and h2 is larger than or equal to 0.4 and less than or equal to 3.4.

4. The display panel according to claim 2, wherein the second bonding portion comprises:

a second conductive layer, wherein the second bonding electrode is located in the second conductive layer; and an insulating layer covering the second conductive layer at a side of the second conductive layer away from the first bonding portion;

wherein side walls of the second conductive layer and the insulating layer facing the protective layer are sealed and connected with the protective layer.

5. The display panel according to claim 4, wherein the insulating layer has a protruding portion at an end where the second bonding electrode is connected with the first bonding electrode;

wherein in the first direction, a distance between an end of the protruding portion away from the first interface and the plane where the first interface is located is larger than a distance between an end of the second conductive layer away from the first interface and the plane where the first interface is located;

wherein the protective layer is sealed and connected with a side of the protruding portion facing the transition portion.

6. The display panel according to claim 5, wherein a surface of the protective layer away from a side of the first bonding portion is a slope surface;

wherein the slope surface forms a climbing structure from a side close to the plane where the first interface is located to a side away from the plane where the first interface is located; and/or, wherein the slope surface forms a downslope structure from the side close to the plane where the first interface is located to the side far away from the plane where the first interface is located.

7. The display panel according to claim 6, wherein a side wall of the protective layer facing a side wall of the second bonding portion exposes a side wall of the protruding portion.

8. The display panel according to claim 6, wherein a side wall of the protective layer facing a side wall of the second bonding portion exposes a part of a side wall of the protruding portion.

9. The display panel according to claim 6, wherein a side wall of the protective layer facing a side wall of the second bonding portion is sealed and connected with a side wall of the protruding portion.

10. The display panel according to claim 9, wherein the protective layer has a main extension portion and a secondary extension portion;

wherein the main extension portion covers the sticking-out portion, and the secondary extension portion covers the insulating layer.

11. The display panel according to claim 10, wherein an extension length of the secondary extension portion in the first direction is less than or equal to 100 μm.

12. The display panel according to claim 7, wherein when the slope surface forms the climbing structure from the side away from the bending portion to the side close to the bending portion, a slope angle of the slop surface is less than or equal to 60°.

13. The display panel according to claim 1, wherein the body portion has an open groove which opens up toward the first bonding portion, and a depth of the open groove in the second direction is larger than or equal to 200 μm.

14. The display panel according to claim 13, wherein the open groove penetrates the body portion in the second direction;

wherein a thickness of the body portion in the second direction is larger than or equal to 120 μm.

15. The display panel according to claim 14, further comprising:

an electronic device located at a side of the chip away from the first bonding portion, wherein an orthographic projection of the electronic device on the first bonding portion and an orthographic projection of the open groove on the first bonding portion is separated.

16. The display panel according to claim 4, wherein the array substrate comprises:

a base substrate;

a base film located at a side of the base substrate;

a first conductive layer located in the first bonding portion at a side of the base substrate away from the base film, wherein the first bonding electrode is located in the first conductive layer; and a third conductive layer located at a side of the first conductive layer away from the base substrate and connected to the second conductive layer;

wherein an orthographic projection of the second conductive layer on the base substrate covers an orthographic projection of the first conductive layer on the base substrate and an orthographic projection of the third conductive layer on the base substrate, and the orthographic projection of the third conductive layer on the base substrate at least partially overlaps with the orthographic projection of the first conductive layer on the base substrate;

wherein side walls of the first conductive layer and the third conductive layer facing the protective layer are sealed and connected with the protective layer.

17. The display panel according to claim 16, wherein the array substrate further comprises:

a support layer located in the display portion and the transition portion at a side of the base film away from the base substrate;

a first adhesive layer located between the support layer and the base film;

a second adhesive layer connecting the base film in the first bonding portion and the support layer in the transition portion; and a cover layer located in the display portion at a side of the base substrate away from the base film.

18. The display panel according to claim 3, wherein L1 is 50 to 200 μm, and h2 is 60 to 120 μm.

19. A method for preparing a display panel, the method comprising:

providing an array substrate and a chip, wherein the array substrate comprises a display portion, a transition portion, a bending portion and a first bonding portion, wherein the transition portion is connected to an end of the display portion, the transition portion is between the display portion and the bending portion, and the bending portion is between the transition portion and the first bonding portion, an end of the first bonding portion away from the bending portion has a first bonding electrode, and the chip is bonded to the first bonding portion;

providing a circuit board, wherein the circuit board comprises a body portion and a second bonding portion, and an end of the second bonding portion away from the body portion has a second bonding electrode;

bonding the second bonding electrode to the first bonding electrode with the body portion and the chip being located at a same side of the second bonding portion in a first direction, wherein the first bonding portion has a sticking-out portion at an end of the first bonding electrode connected to the second bonding electrode, the second bonding portion exposes the sticking-out portion in a second direction, the first direction is parallel with a plane where the display portion is located, and the second direction is perpendicular to a plane where the array substrate is located;

cutting the sticking-out portion using a cutting process, wherein an extension length of the sticking-out portion in the first direction after cutting is L1, a protruding height of the second bonding portion on the first bonding portion along the second direction is h1, and a ratio between L1 and h1 is larger than or equal to 0.4 and less than or equal to 3.5; and bending the bending portion to bend the first bonding portion to a non-display side of the display portion.

20. The method according to claim 19, wherein before cutting the sticking-out portion using the cutting process, the method further comprises:

forming a protective layer at a side of the sticking-out portion, wherein the protective layer is connected to the first bonding electrode and the second bonding electrode;

wherein cutting the sticking-out portion using the cutting process processing comprises:

cutting the protective layer and the sticking-out portion using the cutting process, wherein the protective layer covers the sticking-out portion after cutting.

* * * * *